United States Patent
Harada et al.

(10) Patent No.: US 10,305,102 B2
(45) Date of Patent: May 28, 2019

(54) ACTIVE MATERIAL, NONAQUEOUS ELECTROLYTE BATTERY, BATTERY PACK AND VEHICLE

(71) Applicant: KABUSHIKI KAISHA TOSHIBA, Minato-ku (JP)

(72) Inventors: Yasuhiro Harada, Isehara (JP); Norio Takami, Yokohama (JP); Kazuomi Yoshima, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 187 days.

(21) Appl. No.: 15/261,398

(22) Filed: Sep. 9, 2016

(65) Prior Publication Data
US 2017/0069910 A1  Mar. 9, 2017

(30) Foreign Application Priority Data
Sep. 9, 2015  (JP) .................. 2015-177722

(51) Int. Cl.
*H01M 4/485* (2010.01)
*H01M 10/0525* (2010.01)
(Continued)

(52) U.S. Cl.
CPC .......... *H01M 4/485* (2013.01); *C01G 33/006* (2013.01); *C01G 39/006* (2013.01); (Continued)

(58) Field of Classification Search
None
See application file for complete search history.

(56) References Cited

U.S. PATENT DOCUMENTS

2007/0042273 A1   2/2007  Jumas et al.
2009/0253028 A1*  10/2009  Takagi .............. B60L 11/1874
                                                      429/62
(Continued)

FOREIGN PATENT DOCUMENTS

CN       104282899 A     1/2015
EP       2 784 026 A1    10/2014
(Continued)

OTHER PUBLICATIONS

Song et al. (Preparation of Nb-Substituted Titanates by a Novel Sol-Gel Assisted Solid State Reaction, Inorg. Chem.2009, 48, 6952-6959, Jan. 28, 2009).*

(Continued)

*Primary Examiner* — Carmen V Lyles-Irving
(74) *Attorney, Agent, or Firm* — Oblon, McClelland, Maier & Neustadt, L.L.P.

(57) ABSTRACT

According to one embodiment, there is provided an active material. The active material includes a composite oxide. The composite oxide has a monoclinic crystal structure. The composite oxide is represented by a general formula of $Li_wNa_{4-x}M1_yTi_{6-z}M2_zO_{14+\delta}$. In the general formula, the M1 is at least one element selected from the group consisting of Rb, Cs, K and H; the M2 is at least one metallic element selected from the group consisting of Zr, Sn, V, Nb, Ta, Mo, W, Fe, Co, Mn and Al; w is within a range of $0 \leq w < 12$; x is within a range of $0 < x < 4$; y is within a range of $0 \leq y < 2$; z is within a range of $0 < z < 6$; and $\delta$ is within a range of $-0.3 \leq \delta \leq 0.3$.

13 Claims, 6 Drawing Sheets

(51) Int. Cl.
| | |
|---|---|
| H01M 4/62 | (2006.01) |
| H01M 4/66 | (2006.01) |
| H01M 4/131 | (2010.01) |
| H01M 10/42 | (2006.01) |
| H01M 2/20 | (2006.01) |
| H01M 10/46 | (2006.01) |
| C30B 29/22 | (2006.01) |
| C01G 33/00 | (2006.01) |
| C01G 39/00 | (2006.01) |
| C01G 41/00 | (2006.01) |
| C01G 45/12 | (2006.01) |
| C01G 49/00 | (2006.01) |
| C01G 51/00 | (2006.01) |
| H01M 4/02 | (2006.01) |
| H01M 4/04 | (2006.01) |
| B60L 11/18 | (2006.01) |

(52) U.S. Cl.
CPC ....... *C01G 41/006* (2013.01); *C01G 45/1221* (2013.01); *C01G 49/009* (2013.01); *C01G 51/42* (2013.01); *C30B 29/22* (2013.01); *H01M 2/206* (2013.01); *H01M 4/131* (2013.01); *H01M 4/623* (2013.01); *H01M 4/625* (2013.01); *H01M 4/661* (2013.01); *H01M 10/0525* (2013.01); *H01M 10/425* (2013.01); *H01M 10/46* (2013.01); *B60L 11/1851* (2013.01); *B60Y 2400/112* (2013.01); *C01P 2002/76* (2013.01); *C01P 2002/77* (2013.01); *C01P 2006/40* (2013.01); *H01M 4/0404* (2013.01); *H01M 4/0409* (2013.01); *H01M 4/0435* (2013.01); *H01M 4/0471* (2013.01); *H01M 2004/021* (2013.01); *H01M 2004/027* (2013.01); *H01M 2220/20* (2013.01); *Y02E 60/122* (2013.01); *Y10S 903/907* (2013.01)

(56) References Cited

U.S. PATENT DOCUMENTS

| | | | |
|---|---|---|---|
| 2012/0328930 A1 | 12/2012 | Inagaki et al. | |
| 2014/0147739 A1* | 5/2014 | Nakagawa | H01M 4/131 |
| | | | 429/188 |
| 2014/0295231 A1 | 10/2014 | Ise et al. | |
| 2015/0010820 A1* | 1/2015 | Takami | H01M 4/366 |
| | | | 429/221 |

FOREIGN PATENT DOCUMENTS

| | | |
|---|---|---|
| JP | 2005-267940 | 9/2005 |
| JP | 2006-526255 | 11/2006 |
| JP | 2013-8493 | 1/2013 |
| JP | 2014-032755 A | 2/2014 |
| JP | 2014-103032 | 6/2014 |
| JP | 2014-523084 A | 9/2014 |
| JP | 2015-035420 A | 2/2015 |

OTHER PUBLICATIONS

Wang et al. {Improved lithium storage performance of lithium sodium titanate anode by titanium site substitution with aluminum, Journal of Power Sources 293 (2015) 33-41, May 20, 2015}.*

Extended European Search Report dated Dec. 8, 2016 in Patent Application No. 16186963.1.

Pengfei Wang et al., "Improved lithium storage performance of lithium sodium titanate anode by titanium site substitution with aluminum" Journal of Power Sources, vol. 293, XP55285710, May 20, 2015, pp. 33-41.

I. Belharouak, et al., "$Li_2MTi_6O_{14}$ (M=Sr, Ba): new anodes for lithium-ion batteries", Electrochemistry Communications, 5, 2003, pp. 435-438.

S.Y. Yin, et al., "Reversible lithium storage in $Na_2,Li_2Ti_6O_{14}$ as anode for lithium ion batteries", Electrochemistry Communications, 11, 2009, pp. 1251-1254.

Office Action dated Jan. 15, 2019 in corresponding Japanese Pantet Application No. 2015-177722 (w/ Computer-generated English translation).

Office Action of Jan. 29, 2019 in corresponding Chinese Pantet Application No. 201610814918.9 (w/ Computer-generated English translation).

Original claims of the corresponding Japanese Patent Application No. 2015-177722 (w/ Computer-generated English translation).

Original claims of the corresponding Chinese Pantet Application No. 201610814918.9 (w/ English translation).

* cited by examiner

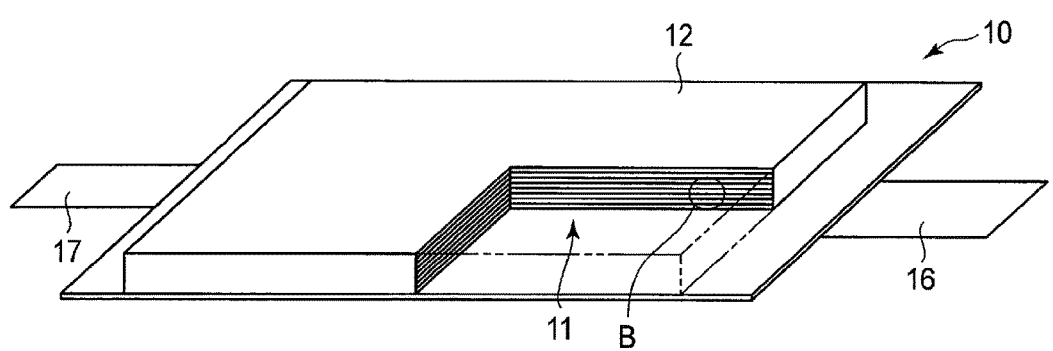
F I G. 5

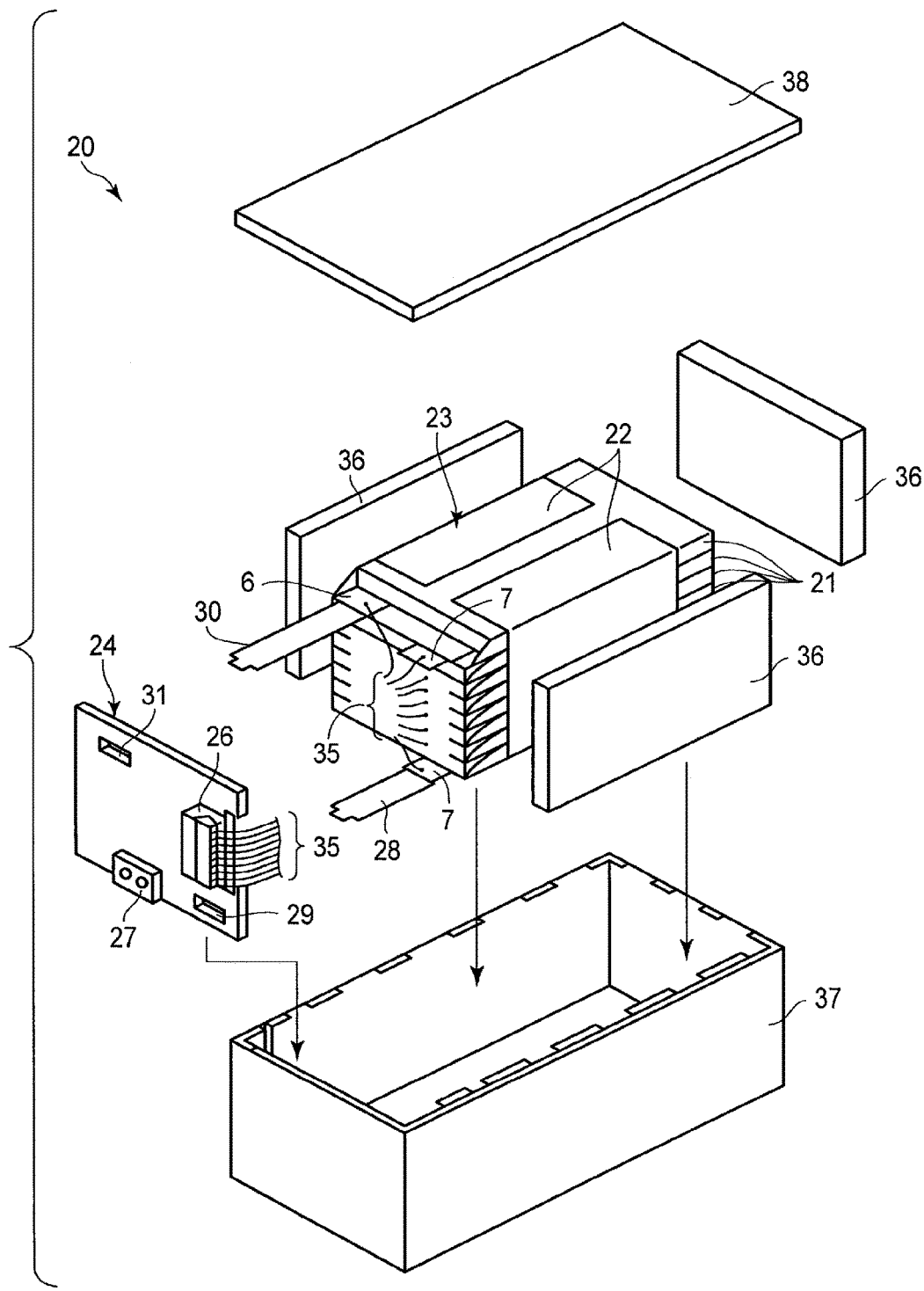
F I G. 7

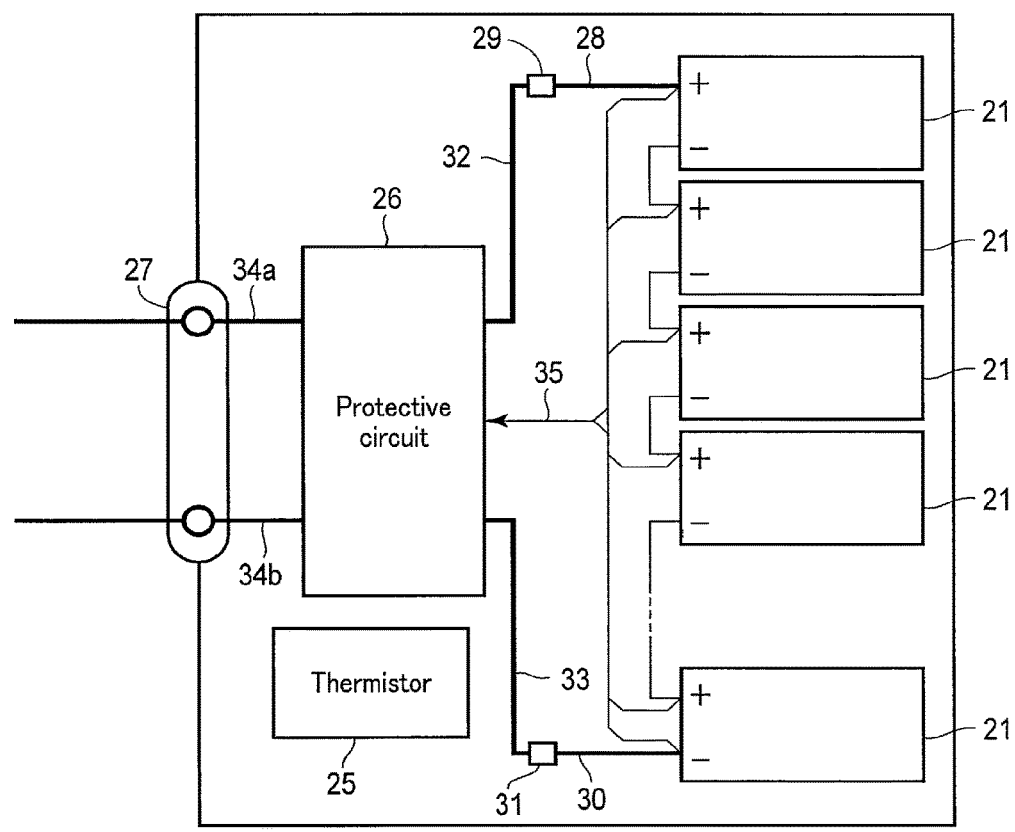
F I G. 8
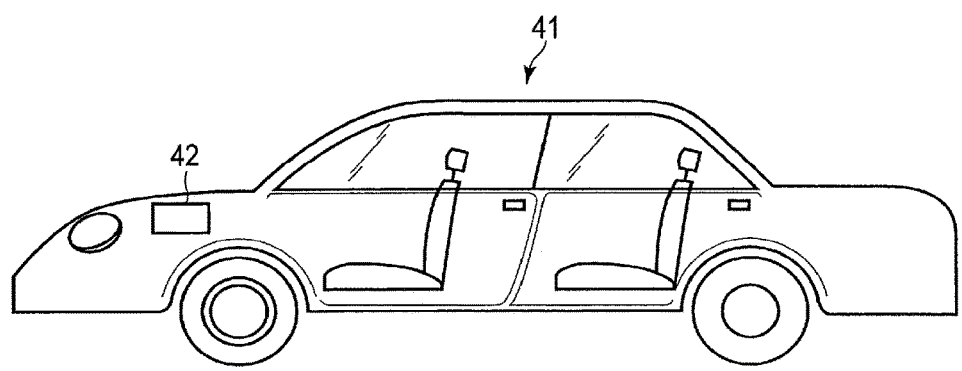
F I G. 9

ACTIVE MATERIAL, NONAQUEOUS ELECTROLYTE BATTERY, BATTERY PACK AND VEHICLE

CROSS-REFERENCE TO RELATED APPLICATIONS

This application is based upon and claims the benefit of priority from the Japanese Patent Application No. 2015-177722, filed Sep. 9, 2015, the entire contents of which are incorporated herein by reference.

FIELD

Embodiments described herein relate generally to an active material for a battery, a nonaqueous electrolyte battery, a battery pack and a vehicle.

BACKGROUND

Recently, a nonaqueous electrolyte battery such as a lithium ion secondary battery has been actively researched and developed as a high energy-density battery. The nonaqueous electrolyte battery is expected to be used as a power source for hybrid vehicles, electric cars, an uninterruptible power supply for base stations for portable telephone, or the like. For this, the nonaqueous electrolyte battery is desired to have a high energy density as well as to be excellent in other performances such as rapid charge-and-discharge performances and long-term reliability. For example, a nonaqueous electrolyte battery enabling rapid charge-and-discharge not only remarkably shortens a charging time but also makes it possible to improve performances related to motivity and to efficiently recover regenerative energy from motivity, in a hybrid vehicle or the like.

In order to enable rapid charge-and-discharge, electrons and lithium ions must be able to migrate rapidly between the positive electrode and the negative electrode. However, when a battery using a carbon-based negative electrode is repeatedly subjected to rapid charge-and-discharge, dendrite precipitation of metal lithium occurs on the electrode, raising the fear as to heat generation and fires caused by internal short circuits.

In light of this, a battery using a metal composite oxide in place of a carbonaceous material in the negative electrode has been developed. Particularly, in a battery using titanium-containing oxide as the negative electrode active material, rapid charge-and-discharge can be stably performed. Such a battery also has a longer life than those using a carbonaceous material.

However, an electrode containing titanium-containing oxide has a higher operating potential based on metal lithium than an electrode containing the carbonaceous material. That is, the electrode containing the titanium-containing oxide is nobler. Furthermore, titanium composite oxide has a lower capacity per weight. Therefore, a battery using titanium composite oxide as the negative electrode active material has a problem that the energy density is lower. Particularly, when a material into which lithium ions are insertion and from which lithium ions are extracted at a high potential based on metal lithium is used as a negative electrode material, a battery using the material has a lower voltage than that of a conventional battery using a carbonaceous material. Therefore, when the battery is used for systems requiring a high voltage such as an electric vehicle and a large-scale electric power storage system, the battery has a problem that the battery series number is increased.

The operating potential of the electrode containing titanium-containing oxide is about 1.5 V based on metal lithium and is higher (nobler) than that of the negative electrode using carbonaceous material. The potential of titanium oxide is due to the redox reaction between $Ti^{3+}$ and $Ti^{4+}$ when lithium is electrochemically inserted and extracted, and is therefore limited electrochemically. It is therefore conventionally difficult to drop the potential of the electrode to improve the energy density.

BRIEF DESCRIPTION OF THE DRAWINGS

FIG. 5 is a partially notched perspective view schematically showing another example of a nonaqueous electrolyte battery according to the second embodiment;

FIG. 7 is an exploded perspective view of one example of a battery pack according to a third embodiment; and FIG. 8 is a block diagram showing an electric circuit of the battery pack in FIG. 7.

FIG. 9 is a schematic sectional view showing an example of an automobile which includes a battery pack according to a third embodiment.

DETAILED DESCRIPTION

In general, according to one embodiment, there is provided an active material. The active material includes a composite oxide. The composite oxide has a monoclinic crystal structure. The composite oxide is represented by a general formula of $Li_wNa_{4-x}M1_yTi_{6-z}M2_zO_{14+\delta}$. In the general formula, the M1 is at least one element selected from the group consisting of Rb, Cs, K and H; the M2 is at least one metallic element selected from the group consisting of Zr, Sn, V, Nb, Ta, Mo, W, Fe, Co, Mn and Al; w is within a range of $0 \leq w < 12$; x is within a range of $0 < x < 4$; y is within a range of $0 \leq y < 2$; z is within a range of $0 < z < 6$; and $\delta$ is within a range of $-0.3 \leq \delta \leq 0.3$.

According to the embodiment, there is provided a nonaqueous electrolyte battery. The nonaqueous electrolyte battery includes a negative electrode, a positive electrode and a nonaqueous electrolyte. The negative electrode includes the active material according to the embodiment.

According to the embodiment, there is provided a battery pack. The battery pack includes the nonaqueous electrolyte battery according to the embodiment.

According to the embodiment, there is provided a vehicle. The vehicle includes the battery pack according to the embodiment.

The embodiments will be explained below with reference to the drawings. In this case, the structures common to all embodiments are represented by the same symbols and duplicated explanations will be omitted. Also, each drawing is a typical view for explaining the embodiments and for promoting an understanding of the embodiments. Though there are parts different from an actual device in shape, dimension and ratio, these structural designs may be properly changed taking the following explanations and known technologies into consideration.

First Embodiment

According to a first embodiment, there is provided an active material for a battery. The active material for a battery includes a composite oxide. The composite oxide has a monoclinic crystal structure. The composite oxide is represented by a general formula of $Li_wNa_{4-x}M1_yTi_{6-z}M2_zO_{14+\delta}$. In the general formula, the M1 is at least one element selected from the group consisting of Rb, Cs, K and H; the M2 is at least one metallic element selected from the group consisting of Zr, Sn, V, Nb, Ta, Mo, W, Fe, Co, Mn and Al; w is within a range of $0 \leq w < 12$; x is within a range of $0 < x < 4$; y is within a range of $0 \leq y < 2$; z is within a range of $0 < z < 6$; and $\delta$ is within a range of $-0.3 \leq \delta \leq 0.3$.

First, an active material for a battery containing composite oxide of $Li_wNa_{4-x}M1_yTi_{6-z}M2_zO_{14+\delta}$ having a monoclinic crystal structure can achieve a nonaqueous electrolyte battery capable of exhibiting a high charge-and-discharge capacity, for the reason described below.

Figure 1:
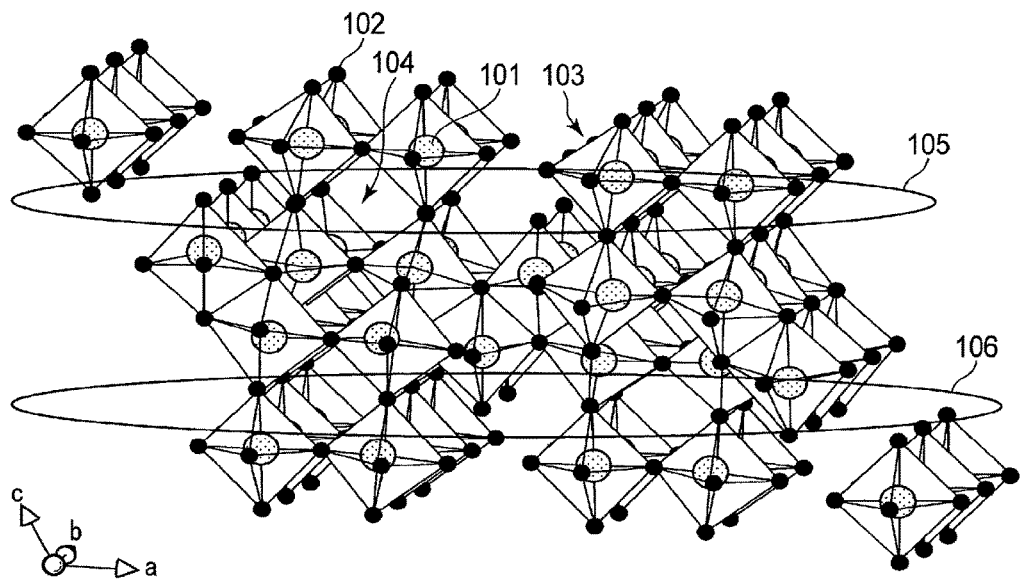
FIG. 1 is a crystal structure diagram of $Na_3Ti_5NbO_{14}$ as an example of composite oxide having symmetry belonging to a space group C2/m.
Figure 2:
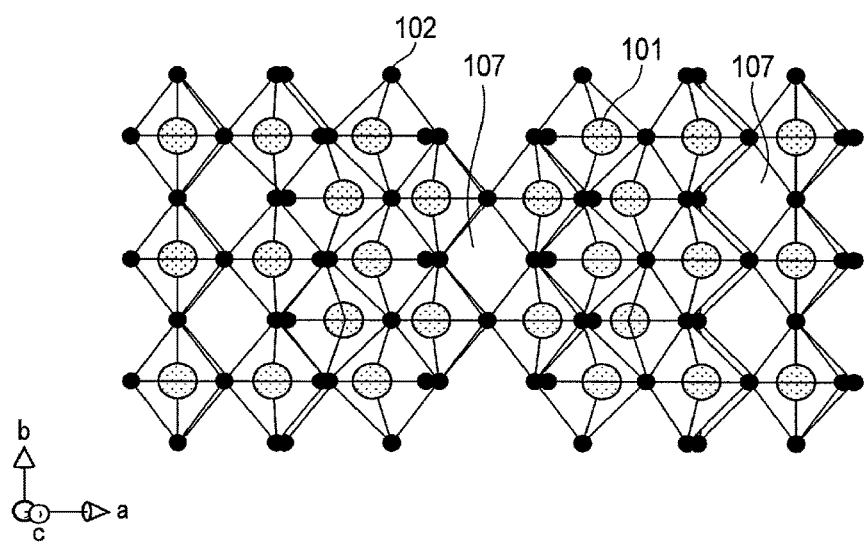
FIG. 2 is a schematic view of the crystal structure in FIG. 1 as viewed from another direction.

FIGS. 1 and 2 show crystal structure diagrams of composite oxide of $Na_3Ti_5NbO_{14}$ as an example of the composite oxide having the monoclinic crystal structure. More specifically, the composite oxide of $Na_3Ti_5NbO_{14}$ having the monoclinic crystal structure shown in FIGS. 1 and 2 has symmetry belonging to the space group C2/m. In FIGS. 1 and 2, the arrangement of each of Ti, Nb and O is shown, but the arrangement of Na is not shown.

In the monoclinic crystal structure of the composite oxide of $Na_3Ti_5NbO_{14}$, as shown in FIG. 1, metal ions 101 and oxide ions 102 constitute skeleton structure portions 103.

In the metal ion sites 101, Nb ions and Ti ions are randomly arranged in the ratio of Nb:Ti=1:5. With the skeleton structure portions 103 being alternately arranged three-dimensionally, a void portion 104 is present between the skeleton structure portions 103. In the void portion 104, sodium and lithium coexist randomly. The void portion 104 can occupy, as shown in FIG. 1, a large portion of a crystal structure 100 as a whole. In addition, the void portion 104 can maintain the structure in a stable manner even if lithium ions are inserted. In FIG. 1, a region 105 and a region 106 are portions having a two-dimensional channel in a [100] direction and a [010] direction. Also, as shown in FIG. 2, a void portion 107 is present in a [001] direction in the monoclinic crystal structure of the composite oxide of $Na_3Ti_5NbO_{14}$. The void portion 107 has a tunnel structure advantageous for conduction of lithium ions and becomes a conduction path in the [001] direction connecting the region 105 and the region 106. With the presence of the conduction path, lithium ions can shuttle between the region 105 and the region 106.

Thus, the crystal structure of the monoclinic composite oxide of $Na_3Ti_5NbO_{14}$ has a large equivalent insertion space of lithium ions and is structurally stable. Further, with the presence of regions having a two-dimensional channel in which lithium ions are diffused at a high speed and a conduction path in the [001] direction connecting such regions in the crystal structure of the monoclinic composite oxide of $Na_3Ti_5NbO_{14}$, insertion and extraction properties of lithium ions into/from the insertion space are improved and also an insertion-and-extraction space of lithium ions is effectively increased. Accordingly, reversibility of lithium ions in the charge and discharge is improved so that a high charge-and-discharge capacity can be provided.

Other composite oxides having a monoclinic crystal structure and which can be represented by a general formula of $Li_wNa_{4-x}M1_yTi_{6-z}M2_zO_{14+\delta}$ can have a crystal structure similar to the crystal structure of the monoclinic composite oxide of $Na_3Ti_5NbO_{14}$ shown in FIGS. 1 and 2. Therefore, an active material for a battery according to the first embodiment containing such a composite oxide can similarly provide a high charge-and-discharge capacity.

Also, for the reason below, an active material for a battery according to the first embodiment can achieve a nonaqueous electrolyte battery capable of exhibiting a high battery voltage and excellent in life characteristics.

First, when the amount of Na in composite oxide changes, the potential behavior of the composite oxide changes. An active material for a battery according to the first embodiment containing monoclinic composite oxide represented by the general formula of $Li_wNa_{4-x}M1_yTi_{6-z}M2_zO_{14+\delta}$ in which x is within a range of $0 < x < 4$ can have an average potential of lithium insertion within a range of 1.2 V (vs. Li/Li$^+$) to 1.5 V (vs. Li/Li$^+$) with respect to the redox potential of metal lithium. Accordingly, a nonaqueous electrolyte battery using an active material for a battery according to the first embodiment as a negative electrode can exhibit a higher battery voltage than a nonaqueous electrolyte battery using, for example, titanium composite oxide whose lithium insertion potential is 1.55 V (vs. Li/Li$^+$).

Also, a monoclinic composite oxide represented by the general formula of $Li_wNa_{4-x}M1_yTi_{6-z}M2_zO_{14+\delta}$ in which z is within a range of $0 < z < 6$ can make uniform a coordination environment of oxide ions with respect to sites into which lithium can be inserted inside the crystal structure. This is because Ti sites or M2 sites and oxide ions form a skeleton structure of high covalency and sites into which lithium can be inserted are formed in a gap of the skeleton structure. In such a crystal structure, Li ions are less subject to electronic correlation with oxide ions and thus, insertion and extraction of lithium can be facilitated. Accordingly, a nonaqueous electrolyte battery using the active material for a battery according to the first embodiment as a negative electrode can exhibit excellent life characteristics.

Thus, the active material for a battery according to the first embodiment can achieve a nonaqueous electrolyte battery capable of exhibiting a high charge-and-discharge capacity, a high battery voltage, and excellent life characteristics.

Hereinafter, the active material for a battery according to the first embodiment will be described in more detail.

The subscript w in the general formula of $Li_wNa_{4-x}M1_yTi_{6-z}M2_zO_{14+\delta}$ for the composite oxide can change in the range of $0 \leq w < 12$ in accordance with the state of charge of the composite oxide. For example, according to a production method described subsequently, for example, a composite oxide represented by the general formula in which the subscript w is 0 can be manufactured. By incorporating the composite oxide in which the subscript w is 0 into a nonaqueous electrolyte battery as a negative electrode active material and charging the nonaqueous electrolyte battery, a state in which the value of the subscript w is increased to a value in the range of more than 0 and less than 12 is generated. Alternatively, a composite oxide can be synthesized in a raw material composition ratio set so that the value of the amount w of Li in the formula is within the range of more than 0 and less than 12 before the initial charge, for example, by the method described below. An active material for a battery containing a composite oxide in a state in which the value of an amount w of Li is in the range of more than 0 and less than 12 before the initial charge can inhibit lithium ions from being trapped in the structure thereof during the initial charge-and-discharge and, as a result, the initial charge-and-discharge efficiency can be improved.

The subscript x in the general formula of $Li_wNa_{4-x}M1_yTi_{6-z}M2_zO_{14+\delta}$ for the composite oxide corresponds to the amount of Na in the crystal structure of the composite oxide. The subscript x is within a range of 0<x<4, preferably within a range of 0.5×3, and particularly preferably within a range of 1×3.

The average operating potential of an electrode containing an active material for a battery according to the first embodiment can be regulated within a range of 1.2 V (vs. $Li/Li^+$) to 1.5 V (vs. $Li/Li^+$) with respect to the redox potential of metal lithium by changing the amount of Na in the crystal structure, that is, changing the value of the subscript x. Accordingly, the design of the operating potential of a battery can be made easier.

The subscript y in the general formula of $Li_wNa_{4-x}M1_yTi_{6-z}M2_zO_{14+\delta}$ for the composite oxide corresponds to the amount of an element M1 contained in the crystal structure of the composite oxide represented by the general formula. The subscript y is within a range of 0≤y<2. The subscript y is preferably within a range of 0≤y≤1 and particularly preferably 0. That is, a composite oxide represented by the general formula of $Li_wNa_{4-x}M1_yTi_{6-z}M2_zO_{14+\delta}$ may not contain the element M1.

The element M1 is at least one of elements selected from the group consisting of Rb, Cs, K and H. The element M1 may be one element from the group consisting of Rb, Cs, K and H. Alternatively, the element M1 may be two or more elements selected from the group consisting of Rb, Cs, K and H. With Rb, Cs or K having a larger ionic radius than Na incorporated in the structure, the crystal lattice is extended and Li ions are thereby made movable more easily. When H is contained in the structure as crystal water, the crystal lattice is similarly extensible easily.

Also, the value of the subscript x is preferably larger than that of the subscript y. In such a case, a monoclinic composite oxide contained in the active material for a battery according to the first embodiment can contain a further vacancy site capable of working as an insertion site of Li ions. The monoclinic composite oxide containing a further vacancy site can achieve a higher charge-and-discharge capacity.

The subscript z in the general formula of $Li_wNa_{4-x}M1_yTi_{6-z}M2_zO_{14+\delta}$ for the composite oxide corresponds to the amount of a metallic element M2 contained in the crystal structure of the composite oxide represented by the general formula. The subscript z is within a range of 0<z≤6, preferably within a range of 1≤z≤5, and particularly preferably within a range of 1≤z≤3.

The metallic element M2 is at least one of elements selected from the group consisting of Zr, Sn, V, Nb, Ta, Mo, W, Fe, Co, Mn and Al. The metallic element M2 can be one element selected from the group consisting of Zr, Sn, V, Nb, Ta, Mo, W, Fe, Co, Mn and Al. Alternatively, the metallic element M2 can be two or more elements selected from the group consisting of Zr, Sn, V, Nb, Ta, Mo, W, Fe, Co, Mn and Al.

In a preferred aspect, the metallic element M2 contains Nb and/or Ta. Nb can be subjected to a divalent reduction from the pentavalent Nb to the trivalent Nb. Thus, by substituting at least a portion of Ti, which can be subjected to a monovalent reduction from the tetravalent Ti to trivalent Ti, by Nb, the insertion amount of lithium of the composite oxide can be increased. On the other hand, tantalum Ta can exhibit chemical and physical properties similar to those of niobium Nb, but has a redox potential different from that of niobium Nb. In an aspect where the metallic element contains Ta, the correlation between oxide ions in the skeleton structure and Ta becomes stronger and thus, an effect of making movement of lithium in the composite oxide easier is achieved. The metallic element M2 preferably contains Nb.

In another preferred aspect, the metallic element M2 contains at least one of elements selected from the group consisting of Fe, Mn and Co. Composite oxide contained in an active material for a battery according to this aspect can exhibit excellent electronic conductivity. As a result, a nonaqueous electrolyte battery produced by using an active material for a battery according to this aspect can exhibit excellent rate characteristics and excellent life characteristics.

In still another preferred aspect, the metallic element M2 contains Mo or V. The composite oxide contained in an active material for a battery according to this aspect can exhibit a low melting point. Such a compound can be synthesized with excellent crystallinity by sintering. An active material for a battery containing a compound with excellent crystallinity can achieve a nonaqueous electrolyte battery capable of exhibiting excellent rate characteristics and excellent life characteristics.

In still another preferred aspect, the metallic element M2 contains Zr or W. Composite oxide contained in an active material for a battery according to this aspect contains Zr or W that is electrochemically inert in the skeleton structure. Such a compound can stabilize crystallinity during charge or discharge.

In still another preferred aspect, the metallic element M2 contains Sn. The composite oxide contained in the active material for a battery according to this aspect is likely to be oxidized or reduced at a potential with respect to metal lithium, the potential being lower than that of Ti. Such a compound has a redox potential during charge or discharge lower than 1.5 V with respect to metal lithium and thus, the energy density of a battery can be increased.

The subscript δ in the general formula of $Li_wNa_{4-x}M1_yTi_{6-z}M2_zO_{14+\delta}$ for the composite oxide can vary within a range of −0.3≤δ≤0.3 depending on oxygen deficiency of the composite oxide represented by the general formula or the amount of oxygen inevitably incorporated during the production process of the active material for a battery. The value of the subscript δ is preferably within a range of −0.1≤δ≤0.1.

A monoclinic composite oxide contained in the active material for a battery according to the first embodiment may be, for example, a substituted composite oxide from the monoclinic composite oxide represented by the general formula of $Li_wNa_4Ti_6O_{14+\delta}$. More specifically, the monoclinic composite oxide of $Li_wNa_{4-x}M1_yTi_{6-z}M2_zO_{14+\delta}$ may be a substituted composite oxide in which a portion of Na in the composite oxide represented by the general formula of $Li_wNa_4Ti_6O_{14+\delta}$ is substituted by the element M1 and/or Na is removed from a portion of the Na sites to create vacancy site, and in which at least a portion of Ti sites is substituted by the metallic element M2.

If the composite oxide contained in the active material for a battery according to the first embodiment is such a substituted composite oxide, the subscript x in the general formula of $Li_wNa_{4-x}M1Ti_{6-z}M2_zO_{14+\delta}$ may be an index indicating the ratio of portions substituted by the element M1 or by the vacancy site in the substituted composite oxide, to sites corresponding to Na sites of the monoclinic composite oxide of $Li_wNa_4Ti_6O_{14+\delta}$. Also, the subscript y in the above general formula may be an index indicating the ratio of portions substituted by the element M1 in the substituted composite oxide, to sites corresponding to Na sites of the composite oxide of $Li_wNa_4Ti_6O_{14+\delta}$. Thus, a combination of the subscript x and the subscript y may be an index indicating the ratio of portions substituted by the element M1 in the substituted composite oxide, to sites corresponding to Na sites of the composite oxide of $Li_wNa_4Ti_6O_{14+\delta}$.

And then, if the composite oxide contained in the active material for a battery according to the first embodiment is such a substituted composite oxide, the subscript z in the general formula of $Li_wNa_{4-x}M1_yTi_{6-z}M2_zO_{14+\delta}$ may be an index indicating the ratio of portions substituted by the metallic element M2 in the substituted composite Oxide, to sites corresponding to Ti sites of the monoclinic composite oxide of $Li_wNa_4Ti_6O_{14+\delta}$.

When the composite oxide contained in the active material for a battery according to the first embodiment is such a substituted composite oxide, the value of the subscript x is preferably larger than that of the subscript y. In such a case, the monoclinic composite oxide contained in the active material for a battery according to the first embodiment can contain, as described above, a vacancy site capable of working as a host site of Li ions. The vacancy site may be a further vacancy site capable of working as a host of Li ions which is formed from a portion of Na sites in the monoclinic crystal structure of the composite oxide represented by the composite oxide of $Li_wNa_4Ti_6O_{14}$. The formation of such a further vacancy site can increase the energy density per unit weight or unit volume while maintaining a lattice volume facilitating insertion or extraction of lithium ions. Further, Li ions can be inserted into and extracted from the substituted composite oxide containing the further vacancy site more easily than the composite oxide represented by the general formula of $Na_4Ti_6O_{14+\delta}$ and, as a result, can achieve a higher charge-and-discharge capacity.

Particularly, when the composite oxide contained in the active material for a battery according to the first embodiment is such a substituted composite oxide and the value of the subscript y is 0, the composite oxide can have a crystal structure containing a portion in the ratio indicated by the subscript x among sites corresponding to Na sites of the composite oxide of $Li_wNa_4Ti_6O_{14+\delta}$ as vacancy sites.

Also, the monoclinic composite oxide contained in the active material for a battery according to the first embodiment can maintain electric neutrality in the crystal structure. That is, in the composite oxide contained in the active material for a battery according to the first embodiment, the total of valencies of elements capable of having positive charges and the total of valencies of elements capable of having negative charges can be made equal as absolute values. A state in which positive charges and negative charges are equal as absolute values in the composite oxide contained in the active material for a battery according to the first embodiment will be described in detail below.

First, Li, Na and the element M1 can exist in a monovalent state in the composite oxide of $Li_wNa_{4-x}M1_yTi_{6-z}M2_zO_{14+\delta}$ contained in the active material for a battery according to the first embodiment.

Also in the composite oxide of $Li_wNa_{4-x}M1_yTi_{6-z}M2_zO_{14+\delta}$, the valence of each of Ti and the metallic element M2 may depend on the state of charge of the composite oxide, that is, an insertion amount w of Li. Here, the valences of Ti and the metallic element M2 will be described by taking a case where the composite oxide of $Li_wNa_{4-x}M1_yTi_{6-z}M2_zO_{14+\delta}$ is in an uncharged state as an example. Here, the composite oxide in an uncharged state refers to a state of a case when the value of the subscript w in the above general formula is 0. That is, the composite oxide in an uncharged state can be represented by the general formula of $Na_{4-x}M1_yTi_{6-z}M2_zO_{14+\delta}$.

In the composite oxide of $Na_{4-x}M1_yTi_{6-z}M2_zO_{14+\delta}$ in an uncharged state, Ti can exist in a tetravalent state. Regarding elements that may be the metallic element M2, in the composite oxide of $Na_{4-x}M1_yTi_{6-z}M2_zO_{14+\delta}$ in an uncharged state, each of Fe, Co, Mn and Al can exist in a trivalent state, each of Zr and Sn can exist in a tetravalent state, each of V, Nb and Ta can exist in a pentavalent state, and each of Mo and W can exist in a hexavalent state.

The valences of elements each capable of having a positive charge in the composite oxide of $Na_{4-x}M1_yTi_{6-z}M2_zO_{14+\delta}$ in an uncharged state can be summarized as described below. The total of valences of Na is (4−x). The total of valences of the element M1 is y. The total of valences of Ti is 4×(6−z). If 1 mol of composite oxide contains $z_3$ mol of a trivalent metallic element $M2_3$, $z_4$ mol of a tetravalent metallic element $M2_4$, $z_5$ mol of a pentavalent metallic element $M2_5$, and $z_6$ mol of hexavalent metallic element $M2_6$, the total of valences of the metallic element M2 is obtained as the sum: $(z_3 \times 3)+(z_4 \times 4)+(z_5 \times 5)+(z_6 \times 6)$ (where $z_3+z_4+z_5+z_6=z$).

On the other hand, the composite oxide contains oxygen as an element capable of having a negative charge. Oxygen can exist in a −2 valent state in the composite oxide. Thus, in the composite oxide $Na_{4-x}M1_yTi_{6-z}M2_zO_{14+\delta}$, the total of valencies of oxygen may be $(-2) \times (14+\delta)$. The subscript $\delta$ here can indicate a value within the range of −0.3 to 0.3. If $\delta$ deviates from the range of $-0.3 \le \delta \le 0.3$, the redox state of each of Ti and the element M2 may deviate from a stable state or lattice defects such as oxygen deficiencies may be caused, which is not preferable due to degradation of battery performance.

Here, assuming here that Ti and the metallic element M2 are in a stable oxidation state and oxygen is present in the proper quantity in the monoclinic composite oxide contained in the active material for a battery according to the first embodiment, $\delta=0$ is obtained and thus, the total of valences of oxygen yields −28 as −2×14. In this case, the fact that the absolute value of the total of valences of elements each capable of having a positive charge coincide with the absolute value of the total of valences of oxygen can be shown by the following formula (1):

$$(4-x)+y+\{4 \times (6-z)\}+\{(z_3 \times 3)+(z_4 \times 4)+(z_5 \times 5)+(z_6 \times 6)\}-28=0 \quad (1)$$

The formula (1) can be organized into the following formula (2):

$$-x+y-4z+(3z_3+4z_4+5z_5+6z_6)=0 \quad (2)$$

That is, by satisfying the condition of the formula (2), the monoclinic composite oxide contained in the active material for a battery according to the first embodiment can maintain electric neutrality in the crystal structure.

Also, as described above, in the monoclinic composite oxide contained in the active material for a battery according to the first embodiment, the total of valences of oxygen may be $(-2) \times (14+\delta)$. Therefore, even if the total of valences of elements each capable of having a positive charge varies within the range of +28±0.6 valencies with respect to −28 valences as the total valency of oxygen when oxygen is present in the proper quantity, a similar effect can be obtained.

Further, in the composite oxide contained in the active material for a battery according to the first embodiment, when w>0, that is, Li is inserted, the valences of Ti and the element M2 become smaller than the valences described above, that is, Ti and the element M2 are reduced to maintain electric neutrality. That is, even if the value of the subscript w changes within the range of 0 or more and less than 12, the composite oxide contained in the active material for a battery according to the first embodiment can maintain electric neutrality.

For example, the monoclinic composite oxide of $Li_wNa_{4-x}$-$M1_yTi_{6-z}M2_zO_{14+\delta}$ satisfying the formula (2) described above may be a substituted composite oxide from the monoclinic composite oxide of $Li_wNa_4Ti_6O_{14+\delta}$, as described above. The monoclinic composite oxide of $Li_wNa_4Ti_6O_{14+\delta}$ may be electrically neutral. If Na is removed from a portion of Na sites in the composite oxide $Li_wNa_4Ti_6O_{14+\delta}$ to create a vacancy site, the total of valences of elements each capable of having a positive charge in the composite oxide decreases. More specifically, if x mol of Na is removed from 1 mol of the composite oxide of $Li_wNa_4Ti_6O_{14+\delta}$ to create a vacancy site for x mol, the total of positive valences of the composite oxide decreases by x. In this case, electric neutrality can be maintained by, for example, causing Li to be inserted into formed vacancies or substituting a portion of Ti sites of the composite oxide of $Li_wNa_4Ti_6O_{14+\delta}$ by the pentavalent element $M2_5$ or the hexavalent element $M2_6$ as the metallic element M2 so as to compensate for the decreased valence x.

Such substitution can increase vacancy sites capable of becoming host sites of Li by decreasing Na serving to hamper conduction of lithium ions while maintaining the crystal structure of the composite oxide of $Li_wNa_4Ti_6O_{14+\delta}$. Also, such vacancy sites can exist in a stable state. Therefore, a substituted composite oxide capable of achieving an improved charge-and-discharge capacity and excellent life characteristics can be obtained.

Particularly, a substituted composite oxide in which a portion of Na sites of the composite oxide of $Li_wNa_4Ti_6O_{14+\delta}$ is substituted by a vacancy that exist in a stable state can achieve a higher reversible capacity because repulsion due to charges of sites that can become host sites of Li ions decreases.

If a portion of Ti sites in the composite oxide of $Li_wNa_4Ti_6O_{14+\delta}$ is substituted only by the trivalent metallic element $M2_3$, the decrease of charges when Na is decreased cannot be compensated for. Thus, it is preferable to substitute Ti sites by the trivalent metallic element $M2_3$ together with a pentavalent or hexavalent metallic element. Even such substitution can decrease Na serving to hamper conduction of lithium ions while maintaining the crystal structure of the composite oxide $Li_wNa_4Ti_6O_{14+\delta}$.

That is, in the general formula of $Li_wNa_{4-x}M1_yTi_{6-z}M2_zO_{14+\delta}$, the subscripts w, x, y, z, $z_3$, $z_4$, $z_5$, $z_6$, and $\delta$ can each take numerical values within the specific ranges described above, but it is preferable to select each numerical value such that the formula (2) described above is satisfied.

If the composite oxide contained in the active material for a battery according to the first embodiment is a substituted composite oxide from the monoclinic composite oxide of $Li_wNa_4Ti_6O_{14+\delta}$, contains the element M1, and satisfies the formula (2), a portion of Na sites in the crystal structure of the composite oxide represented by the general formula of $Li_wNa_4Ti_6O_{14+\delta}$ can be said to be correctly substituted by the element M1. If the composite oxide contained in the active material for a battery according to the first embodiment is a substituted composite oxide from the monoclinic composite oxide of $Li_wNa_4Ti_6O_{14+\delta}$ and satisfies the formula (2), a portion of Ti sites in the crystal structure of the composite oxide represented by the general formula of $Li_wNa_4Ti_6O_{14+\delta}$ can be said to be correctly substituted by the metallic element M2.

In a particularly preferred aspect, the metallic element M2 is Nb and the value of the subscript y is 0. That is, the composite oxide contained in the active material for a battery according to the particularly preferred aspect of the first embodiment can be represented by the general formula of $Li_wNa_{4-x}Ti_{6-z}Nb_zO_{14+\delta}$. Nb can be subjected to a divalent reduction from the pentavalent Nb to the trivalent Nb, and thus, the insertion amount of lithium of the monoclinic composite oxide can be increased by substituting at least a portion of Ti, which can be subjected to monovalent reduction from tetravalent Ti to trivalent Ti, by Nb. Then, the insertion amount of lithium of the monoclinic composite oxide of $Li_wNa_4Ti_6O_{14+\delta}$ can be increased by substituting a portion of Na sites of the monoclinic composite oxide by a vacancy site.

The crystal structure of the composite oxide represented by the general formula of $Li_wNa_{4-x}M1_yTi_{6-z}M2_zO_{14+\delta}$ a is preferably that of a composite oxide having a monoclinic crystal structure with symmetry belonging to one of the space groups C2/m, C2 and Cm. The symmetry of the crystal structure of composite oxide can be investigated from an x-ray diffraction diagram for the composite oxide, obtained by a powder X-ray diffraction method using a Cu-Kα ray.

Also, the lattice constant and the volume of the crystal structure of the composite oxide can be investigated from the X-ray diffraction diagram obtained by the powder X-ray diffraction method using a Cu-Kα ray.

Further, the quantity of crystal water contained in the composite oxide can be determined from the X-ray diffraction diagram obtained by the powder X-ray diffraction method using a Cu-Kα ray. 1 mol of monoclinic composite oxide contained in an active material for a battery according to the first embodiment preferably contains 0.1 mol or more and 2.0 mol or less of crystal water.

The composite oxide contained in the active material for a battery according to the first embodiment may be in a particle form, for example. The average particle size of the composite oxide contained in the active material for a battery according to the first embodiment is not particularly limited, and can be changed according to desired battery characteristics.

The active material for a battery according to the first embodiment preferably contains the above composite oxide particles and a conductive substance such as carbon with which the surface of particles is covered. The active material for a battery of such a preferable aspect can show improved rapid charge-discharge performance. Since the insertion and extraction of lithium may occur via a homogeneous solid state reaction in the composite oxide, the composite oxide has a property that electrical conductivity is increased according as the inserted amount of lithium increases. In the composite oxide, a region where the amount of lithium inserted is low has relatively low electrical conductivity. Therefore, an excellent rapid-charge-and-discharge performance can be obtained, regardless of the inserted amount of lithium, by previously covering the surface of composite oxide particles with a conductive substance such as carbon.

Alternatively, by covering the surface of the composite oxide particles with lithium titanate, which exhibit electrical conductivity in a state where lithium is inserted into it, in place of the conductive substance such as carbon, the same effect can be obtained. In addition, since lithium titanate with which the surface of the composite oxide particles is covered exhibit an insulation property by the extraction of lithium when the battery is internally short-circuited, the lithium titanate can exhibit excellent safety.

<BET Specific Surface Area>

The BET specific surface area of the composite oxide contained in the active material for a battery according to the first embodiment is not particularly limited, and is preferably 5 m$^2$/g or more and less than 200 m$^2$/g. The BET specific surface area is more preferably 5 to 30 m$^2$/g.

When the BET specific surface area is 5 m$^2$/g or more, the contact area with the electrolytic solution can be secured. Thus, good discharge rate performances can be easily obtained and also, a charge time can be shortened. On the other hand, when the BET specific surface area is less than 200 m$^2$/g, reactivity with the electrolytic solution can be prevented from being too high and therefore, the life performance can be improved. When the BET specific surface area is 30 m$^2$/g or less, side reactions with the electrolytic solution can be suppressed, and thereby longer life can be further expected. And, in this case, a coatability of a slurry containing the active material for a battery in the production of an electrode, which will be described later, can be improved.

Here, as the measurement of the specific surface area, a method is used, the method including allowing molecules of which an occupied area in adsorption is known to be adsorbed onto the surface of powder particles at the temperature of liquid nitrogen and determining the specific surface area of the sample from the amount of adsorbed molecules. The most frequently used method is a BET method based on the low temperature/low humidity physical adsorption of an inert gas. This method is based on the best-known theory of the method of calculating the specific surface area in which the Langmuir theory as a monolayer adsorption theory is extended to multilayer adsorption. The specific surface area determined by the above method is referred to as "BET specific surface area".

<Production Method>

The active material for a battery according to the first embodiment can be produced, for example, by synthesis using a solid reaction method as described below or synthesizing an intended compound by subjecting a precursor obtained by a solid phase reaction to ion exchange.

In an exemplary solid phase reaction method, at first, raw materials, such as oxide, compound and a salt, in an appropriate stoichiometric ratio to obtain mixture. The salt is preferably a salt, such as carbonate or nitrate, that can be decomposed at a relatively low temperature to generate an oxide. Next, the obtained mixture is ground and mixed as uniform as possible. Next, the mixture is calcinated. The calcination is performed in an air atmosphere within the temperature range of 600 to 850° C. for a total of 1 to 3 hours. Next, the firing temperature is increased to carry out main-sintering in an air atmosphere within the range of 900 to 1500° C. When composite oxide containing lithium in advance is synthesized, lithium as a light element may be vaporized by firing it at temperature of 900° C. or higher. In such a case, the vaporized amount of lithium under the firing condition is examined and the amount considered to be vaporized is compensate for by providing a raw material containing lithium in excess amount so that a sample of the correct composition is obtained. Because Na ions have a small ionic radius, an intended crystal structure may not be obtainable by the normal solid phase reaction method. In such a case, it is preferable to elevate the main-sintering temperature to about 1300 to 1500° C. and then carry out rapid cooling to obtain a stable crystal phase at a high temperature. The method of rapid cooling treatment is not specifically limited, but it is preferable to immediately put the mixture into liquid nitrogen from the sintering temperature. The cooling rate is preferably within the range of 100° C./s to 1000° C./s.

On the other hand, as described above, the active material for a battery according to the first embodiment can also be synthesized by synthesizing a precursor compound by the solid phase reaction and subjecting the precursor compound to ion exchange to obtain the intended composition. For example, the intended compound composition can be obtained by, for example, immersing the precursor compound obtained by the solid phase reaction into an acid solution of sulfuric acid, hydrochloric acid, nitric acid or the like to exchange alkali cation in the precursor compound with proton and further exchange alkali cation with the intended element M1 (Rb, Cs, K). By using this method, a compound as a high temperature phase or a metastable phase can be synthesized in a stable manner. In this case, with residual protons or crystal water remaining in the crystal lattice, an effect of increasing the lattice volume can be achieved more easily. On the other hand, an intended compound composition may be obtained by carrying out ion exchange of alkali cations in the precursor compound using molten salt containing the intended element M1 without using the proton exchange method. According to this method, the intended composition can be obtained without protons or crystal water remaining in the crystal lattice. While protons or crystal water in the crystal lattice has an effect of increasing an interlayer space of the crystal lattice, ion exchange using molten salt is preferable if degradation of the charge-and-discharge efficiency due to the increasing of the interlayer space is found.

By synthesizing as described above, for example, as described above, a composite oxide whose subscript w in the general formula is 0 can be manufactured. By incorporating a composite oxide whose subscript w is 0 into a nonaqueous electrolyte battery as a negative electrode active material and charging the nonaqueous electrolyte battery, a state in which the value of the Li amount w in the formula is increased to a value in the range of more than 0 and less than 12 is generated. Alternatively, when a lithium source, such as lithium carbonate, is used as a raw material, and the composite oxide is synthesized in a raw material composition ratio so that the value of w is within the range of more than 0 and less than 12, the composite oxide in a state in which the value of w is in the range of more than 0 and less than 12 can also be synthesized. Alternatively, the composite oxide in a state in which the value of w is within the range of more than 0 and less than 12 can be obtained by synthesizing the composite oxide and then immersing the composite oxide into a lithium hydroxide solution or the like. Further, composite oxide in a state in which the value of w is within the range of more than 0 and less than 12 can be obtained by synthesizing the composite oxide and then electrochemically inserting lithium ions.

Next, a method for obtaining an X-ray diffraction diagram of a composite oxide according to a powder X-ray diffraction method, and a method for confirming the composition of the composite oxide will be described.

When an active material to be measured is contained in an electrode material of a nonaqueous electrolyte battery, pre-processing is performed in the following manner.

First, the active material is put into a state close to a state in which lithium ions are perfectly extracted from the crystal of the active material. The state in which the battery is completely discharged refers to a state in which movable Li ions in the compound are extracted by maintaining an electrode including the compound at a potential of +3.0 V with respect to a metal lithium potential for 1 hour or more. To generate a completely discharged state, the battery is disassembled under a dry argon gas atmosphere and then the electrode including the compound is taken out. Using the electrode, a three-pole half-cell in which metal lithium is used as a counter electrode and a reference electrode is constituted. In this case, the electrode operates as a positive electrode with respect to a metal lithium negative electrode. A completely discharged state can be created by passing a current in a charging direction (direction in which Li is extracted from the electrode) until the cell potential in a charge-and-discharge device reaches the potential 3.0 V and maintaining the current still for 1 hour or more after 3.0 V is reached to extract Li ions from the electrode including the compound. A slight amount of lithium ions may remain even in the discharged state, but power X-ray diffraction measurement results described below are not significantly affected. Hereinafter, samples in a completely discharged state by a similar method can be provided for various kinds of analysis.

Next, the battery is disassembled in a glove box filled with argon, and an electrode is taken out. The taken-out electrode is washed with an appropriate solvent, and dried under reduced pressure. For example, ethyl methyl carbonate or the like can be used. After washing and drying, no white deposit such as a lithium salt is confirmed to be present on the surface.

When the electrode is subjected to powder X-ray diffraction measurement, the washed electrode is cut into a size having the same area as the holder of the powder X-ray diffractometer, for use as a measurement sample.

When the washed electrode is subjected to composition analysis, the active material is taken out from the electrode, and the taken-out active material is analyzed, which will be described later.

<Method for Obtaining X-Ray Diffraction Diagram of Composite Oxide According to Powder X-Ray Diffraction Method>

The powder X-ray diffraction measurement of the active material is performed in the following manner.

First, a target sample is ground until the average particle size reaches about 5 μm. Even when the average particle size is originally less than 5 μm, the aggregate is preferably subjected to a grinding treatment in a mortar or the like in order to grind the aggregate. The average particle size can be found by the laser diffraction method. The ground sample is filled in a holder part which is formed on a glass sample plate and has a depth of 0.5 mm. A glass sample plate manufactured by Rigaku is used as the glass sample plate. At this time, much care is necessary to fill the holder part fully with the sample. Special care should be taken to avoid cracking and formation of voids caused by insufficient filling of the sample. Then, another glass plate is used to smooth the surface of the sample by sufficiently pressing the glass plate against the sample. In this case, much care should be taken to avoid too much or too little amount of the sample to be filled, so as to prevent any rises and dents in the basic plane of the glass holder. Then, the glass plate filled with the sample is set in a powder X-ray diffractometer. And then, a diffraction pattern [XRD (X-ray diffraction) pattern] is obtained by using Cu-Kα rays.

In the case where an orientation in which crystal planes are arranged in a specific direction according to the shapes of particles is observed from the results of the Rietveld analysis, there is the possibility of deviation of peak position and variation in an intensity ratio, depending on the way of filling the sample when the glass plate is filled with the sample. Such a sample having high orientation is measured using a capillary (cylindrical glass narrow tube). Specifically, the sample is inserted into the capillary, which is then mounted on a rotary sample table to measure while being rotated. Such a measuring method can provide the result of reducing the influence of orientation.

As an apparatus for powder X-ray diffraction measurement, SmartLab manufactured by Rigaku is used. Measurement is performed under the following condition: Cu target; 45 kV, 200 mA; soller slit: 5 degrees in both incident light and received light; step width: 0.02 deg; scan speed: 20 deg/min; semiconductor detector: D/teX Ultra 250; sample plate holder: flat glass sample plate holder (0.5 mm in thickness); measurement range: $5° \leq 2\theta \leq 90°$. When another apparatus is used, measurement using a standard Si powder for powder X-ray diffraction is performed under conditions where a peak intensity and a peak top position correspond to those by obtained using the above apparatus so as to obtain measurement results equivalent to those described above.

The X-ray diffraction (XRD) pattern obtained herein must be applicable to Rietveld analysis. In order to collect the data for Rietveld analysis, the measurement time or X-ray intensity is appropriately adjusted in such a manner that the step width is made ⅓ to ⅕ of the minimum half width of the diffraction peaks, and the intensity at the peak position of strongest reflected intensity is 5,000 cps or more.

The XRD pattern obtained as described above is analyzed by the Rietveld method. In the Rietveld method, the diffraction pattern is calculated from the crystal structure model which has been previously estimated. The parameters of the crystal structure (lattice constant, atomic coordinate, and occupancy or the like) can be precisely analyzed by fitting all the calculated values and measurement values. Thereby, the characteristics of the crystal structure of the synthesized composite oxide can be determined. The occupancies of constitutional elements in each of the sites can be determined. A fitting parameter S is used as the scale for estimating the degree of agreement between the measured intensity and the calculated intensity in the Rietveld analysis. The S value must be less than 1.8 in the analysis. When determining the occupancies in each of the sites, the standard deviation $\sigma_j$ must be taken into consideration. The fitting parameter S and standard deviation $\sigma_j$ defined herein are estimated using the formula described in "Funmatsu X sen Kaisetsu no Jissai (Reality of Powder X-Ray Analysis)", X-Ray Analysis Investigation Conversazione, The Japan Society for Analytical Chemistry, written and edited by Izumi Nakai and Fujio Izumi (Asakura Publishing Co., Ltd.).

By the above method, information about the crystal structure of the active material to be measured can be obtained. For example, if the active material for a battery according to the first embodiment is measured as described above, it is found that the active material for a battery to be measured contains a composite oxide having a monoclinic crystal structure. Also, by making measurements as described above, the crystal structure to be measured can be examined for symmetry, for example, the space group C2/m.

When the active material to be measured is contained in the electrode material of the nonaqueous electrolyte battery, first, the electrode is taken out from the nonaqueous electrolyte battery according to the previously described procedure. The taken-out and washed electrode is cut to the size almost equal to the area of the holder of a powder X-ray diffractometer, and used as the measurement sample.

The obtained measurement sample is affixed directly to the glass holder, and measured. In this case, the position of the peak originated from the electrode substrate such as a metal foil is previously measured. The peaks of other components such as a conductive agent and a binder are also previously measured. When the peaks of the substrate and active material overlap to each other, it is desirable that the layer containing the active material (e.g., the below-described active material layer) is separated from the substrate, and subjected to measurement. This is a process for separating the overlapping peaks when the peak intensity is quantitatively measured. For example, the active material layer can be separated by irradiating the electrode substrate with an ultrasonic wave in a solvent. The active material layer is inserted into the capillary, mounted on the rotary sample table, and measured. As a result of this process, the XRD pattern of the active material can be obtained with the influence of the orientation reduced.

<Method for Confirming Composition of Composite Oxide>

The composition of the active material for a battery can be analyzed using Inductively Coupled Plasma (ICP) emission spectroscopy, for example. In this case, the abundance ratios of elements depend on the sensitivity of an analyzing device to be used. Therefore, when the composition of the active material for a battery as an example according to the first embodiment is analyzed, for example, using ICP emission spectroscopy, the numerical values may deviate due to errors of the measuring device from the previously described element ratios. However, even if the measurement results deviate as described above in the error range of the analyzing device, the active material for a battery as an example according to the first embodiment can sufficiently exhibit the previously described effects.

In order to measure the composition of the active material for a battery included in the battery according to ICP emission spectroscopy, the following procedure is specifically performed. First, according to the previously described procedure, an electrode containing an active material to be measured is taken out from a nonaqueous electrolyte battery, and washed. The washed electrode is put in a suitable solvent, and irradiated with an ultrasonic wave. For example, an electrode is put into ethyl methyl carbonate in a glass beaker and the glass beaker is vibrated in an ultrasonic washing machine, and thereby an electrode layer containing an electrode active material can be separated from a current collector. Next, the separated electrode layer is dried under reduced pressure. The obtained electrode layer is ground in a mortar or the like to provide a powder containing the target active material for a battery, conductive auxiliary agent, and binder or the like. By dissolving the powder in an acid, a liquid sample containing the active material for a battery can be prepared. At this time, hydrochloric acid, nitric acid, sulfuric acid, and hydrogen fluoride or the like can be used as the acid. The composition of the active material for a battery can be found by subjecting the liquid sample to ICP emission spectrochemical analysis.

<Determination Method of Composition of Composite Oxide in Completely Discharged State>

The composite oxide contained in an active material for a battery according to the first embodiment may, once lithium is inserted, contain lithium after being discharged up to a discharge final potential. For the composite oxide containing lithium at the discharge final potential, the composition thereof in a completely discharged state can be determined according to the procedure described below. First, the composition of the composite oxide is analyzed by the procedure described above. Li is removed from the composition formula obtained by the above composition analysis without decreasing the numbers of other elements. The composition formula obtained in this manner can be determined as a composition formula of a composite oxide in a completely discharged state, that is, in a state of $w=0$.

According to the first embodiment, an active material for a battery containing composite oxide having a monoclinic crystal structure is provided. The composite oxide is represented by the general formula of $Li_wNa_{4-x}\text{-}M1_yTi_{6-z}M2_zO_{14+\delta}$. The composite oxide can provide a high charge-and-discharge capacity. Also, the average operating potential of the composite oxide can be adjusted by changing the Na amount and can take values within the range of 1.2 V (vs. Li/Li$^+$) to 1.5 V (vs. Li/Li$^+$). Further, the composite oxide can have a crystal structure that can more easily insert and extract lithium. As a result, the active material for a battery according to the first embodiment can achieve a nonaqueous electrolyte battery capable of exhibiting a high charge-and-discharge capacity, a high battery voltage, and excellent life characteristics.

Second Embodiment

According to a second embodiment, a nonaqueous electrolyte battery is provided. The nonaqueous electrolyte battery includes a negative electrode containing the active material for a battery according to the first embodiment, a positive electrode, and a nonaqueous electrolyte.

The nonaqueous electrolyte battery according to the second embodiment can further include a separator provided between the positive electrode and the negative electrode. The positive electrode, the negative electrode, and the separator can constitute an electrode group. The nonaqueous electrolyte may be held in the electrode group.

The nonaqueous electrolyte battery according to the second embodiment can further include a container member accommodating the electrode group and the nonaqueous electrolyte.

The nonaqueous electrolyte battery according to the second embodiment can further include a positive electrode terminal electrically connected to the positive electrode and a negative electrode terminal electrically connected to the negative electrode. At least a part of the positive electrode terminal and at least a part of the negative electrode terminal may be extended to the outside of the container member.

Hereinafter, the negative electrode, the positive electrode, the nonaqueous electrolyte, the separator, the container member, the positive electrode terminal, and the negative electrode terminal will be described in detail.

1) Negative Electrode

The negative electrode can include a current collector and a negative electrode layer (negative electrode active material-containing layer). The negative electrode layer may be formed on one or both surfaces of the current collector. The negative electrode layer can contain a negative electrode active material, and optionally a conductive agent and a binder.

The active material for a battery according to the first embodiment can be contained in a negative electrode layer as a negative electrode active material. As described above, the active material for a battery according to the first embodiment can exhibit a high charge-and-discharge capacity, adjust the average operating potential, and exhibit excellent life characteristics. Therefore, a nonaqueous electrolyte battery according to a second embodiment including a negative electrode containing the active material for a battery according to the first embodiment can exhibit a high charge-and-discharge capacity, a high battery voltage, and excellent life characteristics.

In the negative electrode, the active material for a battery according to the first embodiment may be singly used as the negative electrode active material, but a mixture prepared by mixing the active material for a battery according to the first embodiment with another active material may also be used. Examples of other active materials include lithium titanate having a ramsdellite structure (e.g., $Li_2Ti_3O_7$), lithium titanate having a spinel structure (e.g., $Li_4Ti_5O_{12}$), monoclinic type titanium dioxide ($TiO_2$ (B)), anatase type titanium dioxide, rutile type titanium dioxide, a hollandite-type titanium composite oxide, and a monoclinic type niobium titanium composite oxide (e.g., $Nb_2TiO_7$).

The conductive agent is added to improve a current collection performance and to suppress the contact resistance between the negative electrode active material and the current collector. Examples of the conductive agent include carbonaceous substances such as vapor grown carbon fiber (VGCF), acetylene black, carbon black, and graphite.

The binder is added to fill gaps in the dispersed negative electrode active material and also to bind the negative electrode active material with the current collector. Examples of the binder include polytetrafluoroethylene (PTFE), polyvinylidene fluoride (PVdF), fluorine rubber, styrene-butadiene rubber, a polyacrylic acid compound, and an imide compound.

The blending ratios of the active material, conductive agent and binder in the negative electrode layer are preferably 68% by mass to 96% by mass, 2% by mass to 30% by mass, and 2% by mass to 30% by mass, respectively. When the content of the conductive agent is 2% by mass or more, the current collection performance of the negative electrode layer can be improved. When the content of the binder is 2% by mass or more, binding between the negative electrode layer and current collector is sufficiently achieved, and excellent cycling characteristics can be expected. On the other hand, each of the contents of the conductive agent and binder is preferably 28% by mass or less, thereby increasing the capacity.

As the current collector, a material which is electrochemically stable at the lithium insertion and extraction potential of the negative electrode active material is used. The current collector is preferably made of copper, nickel, stainless steel or aluminum, or an aluminum alloy containing one or more elements selected from Mg, Ti, Zn, Mn, Fe, Cu, and Si. The thickness of the current collector is preferably 5 to 20 µm. The current collector having such a thickness can keep a balance between the strength and weight reduction of the negative electrode.

By using the active material for a battery according to the first embodiment, the density of the negative electrode layer (excluding the current collector) can be set to the range of 1.8 $g/cm^3$ to 2.8 $g/cm^3$. The negative electrode in which the density of the negative electrode layer is within the range can exhibit an excellent energy density and excellent electrolytic solution holdablility. More preferably, the density of the negative electrode layer is 2.1 $g/cm^3$ to 2.6 $g/cm^3$.

The negative electrode is produced by, for example, suspending a negative electrode active material, a binder, and a conductive agent in an ordinary solvent to prepare a slurry, applying the slurry to a current collector, drying the coating to form a negative electrode layer, and then pressing the layer. Alternatively, the negative electrode may be also produced by forming a negative electrode active material, a binder, and a conductive agent into pellets to produce a negative electrode layer, and placing it on a current collector.

2) Positive Electrode

The positive electrode can include a current collector and a positive electrode layer (positive electrode active material-containing layer). The positive electrode layer may be formed on one or both surfaces of the current collector. The positive electrode layer can include a positive electrode active material, and optionally a conductive agent and a binder.

The positive electrode active material may be, for example, an oxide or sulfide. Examples of the oxide and sulfide include a compound into which Li can be inserted and from which Li can be extracted. Specific examples thereof include manganese dioxide ($MnO_2$), iron oxide, copper oxide, nickel oxide, lithium manganese composite oxide (e.g., $Li_xMn_2O_4$ or $Li_xMnO_2$), lithium nickel composite oxide (e.g., $Li_xNiO_2$), lithium cobalt composite oxide (e.g., $Li_xCoO_2$), lithium nickel cobalt composite oxide (e.g., $LiNi_{1-y}Co_yO_2$), lithium manganese cobalt composite oxide (e.g., $Li_xMn_yCo_{1-y}O_2$), lithium manganese nickel composite oxide having a spinel structure (e.g., $Li_xMn_{2-y}Ni_yO_4$), lithium phosphorus oxide having an olivine structure (e.g., $Li_xFePO_4$, $Li_xFe_{1-y}Mn_yPO_4$, and $Li_xCoPO_4$), iron sulfate [$Fe_2(SO_4)_3$], vanadium oxide (e.g., $V_2O_5$), and lithium nickel cobalt manganese composite oxide. In the above-described formula, $0<x\leq1$, and $0<y\leq1$. As the active material, one of these compounds may be used singly, or combination of two or more of the compounds can be used.

More preferred examples of the positive electrode active material include lithium manganese composite oxide having a high positive electrode voltage (e.g., $Li_xMn_2O_4$), lithium nickel composite oxide (e.g., $Li_xNiO_2$), lithium cobalt composite oxide (e.g., $Li_xCoO_2$), lithium nickel cobalt composite oxide (e.g., $LiNi_{1-y}Co_yO_2$), lithium manganese nickel composite oxide having a spinel structure (e.g., $Li_xMn_{2-y}Ni_yO_4$), lithium manganese cobalt composite oxide (e.g., $Li_xMn_yCo_{1-y}O_2$), lithium iron phosphate (e.g., $Li_xFePO_4$), and lithium nickel cobalt manganese composite oxide. In the above-described formula, $0<x\leq1$, and $0<y\leq1$.

When an ordinary-temperature molten salt is used as the nonaqueous electrolyte of the battery, preferred examples of the positive electrode active material include lithium iron phosphate, $Li_xVPO_4F$ ($0\leq x\leq1$), lithium manganese composite oxide, lithium nickel composite oxide, and lithium nickel cobalt composite oxide. Since these compounds have low reactivity with ordinary-temperature molten salts, they can improve the cycle life.

The primary particle size of the positive electrode active material is preferably 100 nm to 1 µm. The positive electrode active material having a primary particle size of 100 nm or more is easy to handle during industrial production. The positive electrode active material having a primary particle size of 1 µm or less can allow lithium ions to smoothly diffuse in solids.

The specific surface area of the positive electrode active material is preferably 0.1 $m^2/g$ to 10 $m^2/g$. The positive electrode active material having a specific surface area of 0.1 $m^2/g$ or more can secure sufficient sites in which lithium ions can be inserted and extracted. The positive electrode active material having a specific surface area of 10 $m^2/g$ or less is easy to handle during industrial production, and can secure a good charge-and-discharge cycle performance.

The binder is added to bind the positive electrode active material with the current collector. Examples of the binder include polytetrafluoroethylene (PTFE), polyvinylidene fluoride (PVdF), fluorine rubber, a polyacrylic acid compound, and an imide compound.

The conductive agent is as necessary added to improve the current collection performance, and to suppress the contact resistance between the positive electrode active material and current collector. Examples of the conductive agent include carbonaceous substances such as acetylene black, carbon black and graphite.

In the positive electrode layer, the blending ratios of the positive electrode active material and binder are preferably 80% by mass to 98% by mass, and 2% by mass to 20% by mass, respectively.

When the binder content is 2% by mass or more, sufficient electrode strength can be achieved. When the binder content is 20% by mass or less, the loading of the insulator in the electrode can be reduced, and thereby the internal resistance can be decreased.

When a conductive agent is added, the blending ratios of the positive electrode active material, binder, and conductive agent are preferably 77% by mass to 95% by mass, 2% by mass to 20% by mass, and 3% by mass to 15% by mass, respectively. When the content of the conductive agent is 3% by mass or more, the above-described effects can be achieved. By setting the amount of the positive electrode conductive agent to 15% by mass or less, the decomposition of a nonaqueous electrolyte on the surface of the positive electrode conductive agent in high-temperature storage can be reduced.

The current collector is preferably an aluminum foil, or an aluminum alloy foil containing one or more elements selected from Mg, Ti, Zn, Ni, Cr, Mn, Fe, Cu, and Si.

The thickness of the aluminum foil or aluminum alloy foil is preferably 5 μm to 20 μm, and more preferably 15 μm or less. The purity of the aluminum foil is preferably 99% by mass or more. The content of the transition metal such as iron, copper, nickel, or chromium contained in the aluminum foil or aluminum alloy foil is preferably 1% by mass or less.

The positive electrode is produced by, for example, suspending a positive electrode active material, a binder, and as necessary a conductive agent in an appropriate solvent to prepare a slurry, applying the slurry to a positive electrode current collector, drying the coating to form a positive electrode layer, and then pressing the layer. Alternatively, the positive electrode may be also produced by forming an active material, a binder, and as necessary a conductive agent into pellets to produce a positive electrode layer, and placing it on a current collector.

3) Nonaqueous Electrolyte

The nonaqueous electrolyte may be, for example, a liquid nonaqueous electrolyte which is prepared by dissolving an electrolyte in an organic solvent, or gel-like nonaqueous electrolyte which is a composite of a liquid electrolyte and a polymer material.

The liquid nonaqueous electrolyte is preferably prepared by dissolving an electrolyte in an organic solvent in the concentration of 0.5 mol/L to 2.5 mol/L.

Examples of the electrolyte include lithium salts such as lithium perchlorate ($LiClO_4$), lithium hexafluorophosphate ($LiPF_6$), lithium tetrafluoroborate ($LiBF_4$), lithium hexafluoroarsenate ($LiAsF_6$), lithium trifluoromethanesulfonate ($LiCF_3SO_3$), and lithium bistrifluoromethylsulfonylimide $[LiN(CF_3SO_2)_2]$, and mixtures thereof. The electrolyte is preferably resistant to oxidation even at a high potential, and most preferably $LiPF_6$.

Examples of the organic solvent include a cyclic carbonate such as propylene carbonate (PC), ethylene carbonate (EC), or vinylene carbonate; a chain carbonate such as diethyl carbonate (DEC), dimethyl carbonate (DMC), or methyl ethyl carbonate (MEC); a cyclic ether such as tetrahydrofuran (THF), 2-methyl tetrahydrofuran (2MeTHF), or dioxolane (DOX); a chain ether such as dimethoxy ethane (DME) or diethoxy ethane (DEE); γ-butyrolactone (GBL), acetonitrile (AN), and sulfolane (SL). One of these organic solvents can be used alone or a mixed solvent can be used.

Examples of the polymeric material include polyvinylidene fluoride (PVdF), polyacrylonitrile (PAN), and polyethylene oxide (PEO).

Alternatively, the nonaqueous electrolyte may be, for example, an ordinary-temperature molten salt (ionic melt) containing lithium ions, a polymer solid electrolyte, or an inorganic solid electrolyte.

The ordinary-temperature molten salt (ionic melt) means compounds which can exist in a liquid state at ordinary temperature (15 to 25° C.) among organic salts constituted of combinations of organic cations and anions. The ordinary-temperature molten salt includes an ordinary-temperature molten salt which exists alone as a liquid, an ordinary-temperature molten salt which becomes a liquid after being mixed with an electrolyte, and an ordinary-temperature molten salt which becomes a liquid after being dissolved in an organic solvent. In general, the melting point of the ordinary-temperature molten salt used in nonaqueous electrolyte batteries is 25° C. or below.

The organic cations generally have a quaternary ammonium skeleton.

The polymer solid electrolyte is prepared by dissolving the electrolyte in a polymeric material, and solidifying it.

The inorganic solid electrolyte is a solid substance having lithium ion conductivity.

4) Separator

The separator may be made of, for example, a porous film or synthetic resin nonwoven fabric containing polyethylene, polypropylene, cellulose, or polyvinylidene fluoride (PVdF). Among these, a porous film containing polyethylene or polypropylene can improve safety because the porous film melts at a fixed temperature to be able to shut off a current.

5) Container Member

The container member may be, for example, a laminate film having a thickness of 0.5 mm or less, or a metal case having a thickness of 1 mm or less. The thickness of the laminate film is more preferably 0.2 mm or less. The thickness of the metal case is more preferably 0.5 mm or less, and still more preferably 0.2 mm or less.

The shape of the container member is not particularly limited, and may be, for example, flat (thin), square, cylinder, coin, or button-shaped. The container member depends on the size of the battery, and may be that for a compact battery mounted on mobile electronic devices, and a large battery mounted on two- to four-wheel automobiles.

The laminate film used herein is a multilayer film including resin layers and a metal layer sandwiched between the resin layers. The metal layer is preferably an aluminum foil or an aluminum alloy foil for reducing weight. The resin layer may be, for example, a polymeric material such as polypropylene (PP), polyethylene (PE), nylon, or polyethylene terephthalate (PET). The laminate film may be heat-sealed to be formed into the shape of a container member.

The metal case is made of aluminum or an aluminum alloy, for example. As the aluminum alloy, an alloy containing an element such as magnesium, zinc, or silicon is preferable. If a transition metal such as iron, copper, nickel, or chromium is contained in the alloy, the content thereof is preferably set to 1% by mass or less.

6) Positive Electrode Terminal and Negative Electrode Terminal

The positive electrode terminal may be made of, for example, a material which is electrically stable in the potential range of 3 V to 5 V based on redox potential of lithium, and has electrical conductivity. Specifically, the positive electrode terminal is made of aluminum or an aluminum alloy containing Mg, Ti, Zn, Mn, Fe, Cu, and Si or the like. The positive electrode terminal is preferably made of the same material as the positive electrode current collector in order to reduce contact resistance with the positive electrode current collector.

The negative electrode terminal may be made of a material which is electrochemically stable at the potential at which Li is inserted into and extracted from the negative electrode active material, and has electrical conductivity. Specific examples of the material for the negative electrode terminal include copper, nickel, stainless steel, or aluminum. The negative electrode terminal is preferably made of the same material as the negative electrode current collector in order to reduce the contact resistance with the negative electrode current collector.

Next, the nonaqueous electrolyte battery according to the second embodiment will be more specifically described with reference to the drawings.

First, a nonaqueous electrolyte battery as an example according to the second embodiment will be described with reference to FIGS. 3 and 4.

Figure 3:
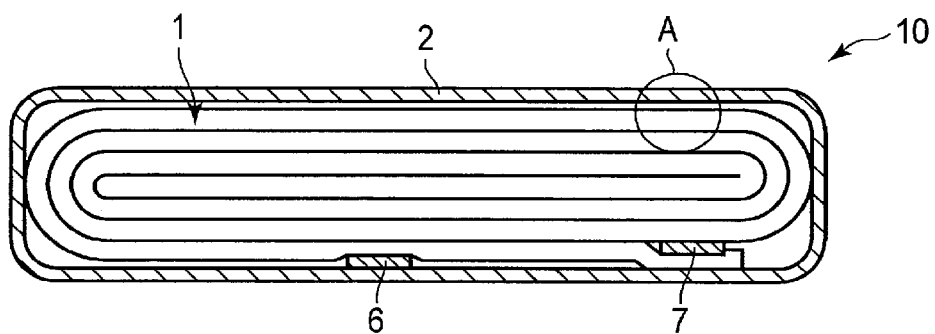
FIG. 3 is a sectional view of one example of a nonaqueous electrolyte battery according to a second embodiment.

FIG. 3 is a cross sectional view of a nonaqueous electrolyte battery as an example according to the second embodiment. FIG. 4 is an enlarged cross sectional view showing a portion A in FIG. 3.

Figure 4:
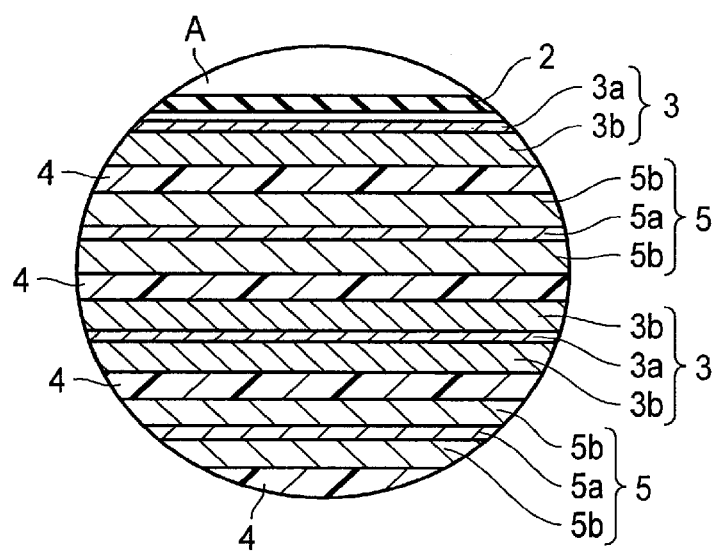
FIG. 4 is an enlarged sectional view of an A portion in FIG. 3.

A nonaqueous electrolyte battery 10 shown in FIGS. 3 and 4 includes a bag-shaped container member 2 shown in FIG. 3, an electrode group 1 shown in FIGS. 3 and 4, and a nonaqueous electrolyte (not shown). The electrode group 1 and the nonaqueous electrolyte are accommodated in the container member 2. The nonaqueous electrolyte is held in the electrode group 1.

The bag-shaped container member 2 is made of a laminate film including two resin layers and a metal layer sandwiched between the resin layers.

As shown in FIG. 3, the electrode group 1 is a coiled electrode group in a flat form. The coiled electrode group 1 in a flat form is formed by, as shown in FIG. 4, spirally winding a laminate which includes, from the outside to the inside, a negative electrode 3, a separator 4, a positive electrode 5, and a separator 4, and then press-forming the wound laminate.

The negative electrode 3 includes a negative electrode current collector 3a and a negative electrode layer 3b. The negative electrode layer 3b contains the active material for a battery according to the first embodiment. The negative electrode 3 in the outermost layer has a configuration in which a negative electrode layer 3b is formed on one side which is the internal surface of a negative electrode current collector 3a as shown in FIG. 4. In the other portion of the negative electrode 3, the negative electrode layers 3b are formed on both surfaces of the negative electrode current collector 3a.

The positive electrode 5 includes a positive electrode current collector 5a and positive electrode layers 5b formed on both surfaces of the positive electrode current collector 5a.

As shown in FIG. 3, in the vicinity of the outer peripheral edge of the coiled electrode group 1, a negative electrode terminal 6 is connected to the negative electrode current collector 3a in the outermost negative electrode 3, and a positive electrode terminal 7 is connected to the positive electrode current collector 5a in the inside positive electrode 5. The negative electrode terminal 6 and the positive electrode terminal 7 are extended out from the opening of the bag-shaped container member 2.

The nonaqueous electrolyte battery 10 shown in FIGS. 3 and 4 can be produced according to the following procedure, for example. First, an electrode group 1 is produced. The electrode group 1 is then enclosed in a bag-shaped container member 2. In this case, one ends of a negative electrode terminal 6 and positive electrode terminal 7 are protruded toward the outside of the container member 2. Next, the circumference of the container member 2 is heat-sealed while a part thereof remains unsealed. Next, for example, a liquid nonaqueous electrolyte is injected via the opening of the bag-shaped container member 2 which is not heat-sealed. Finally, the opening is heat-sealed, and thereby the coiled electrode group 1 and the liquid state nonaqueous electrolyte are completely sealed.

Figure 6:
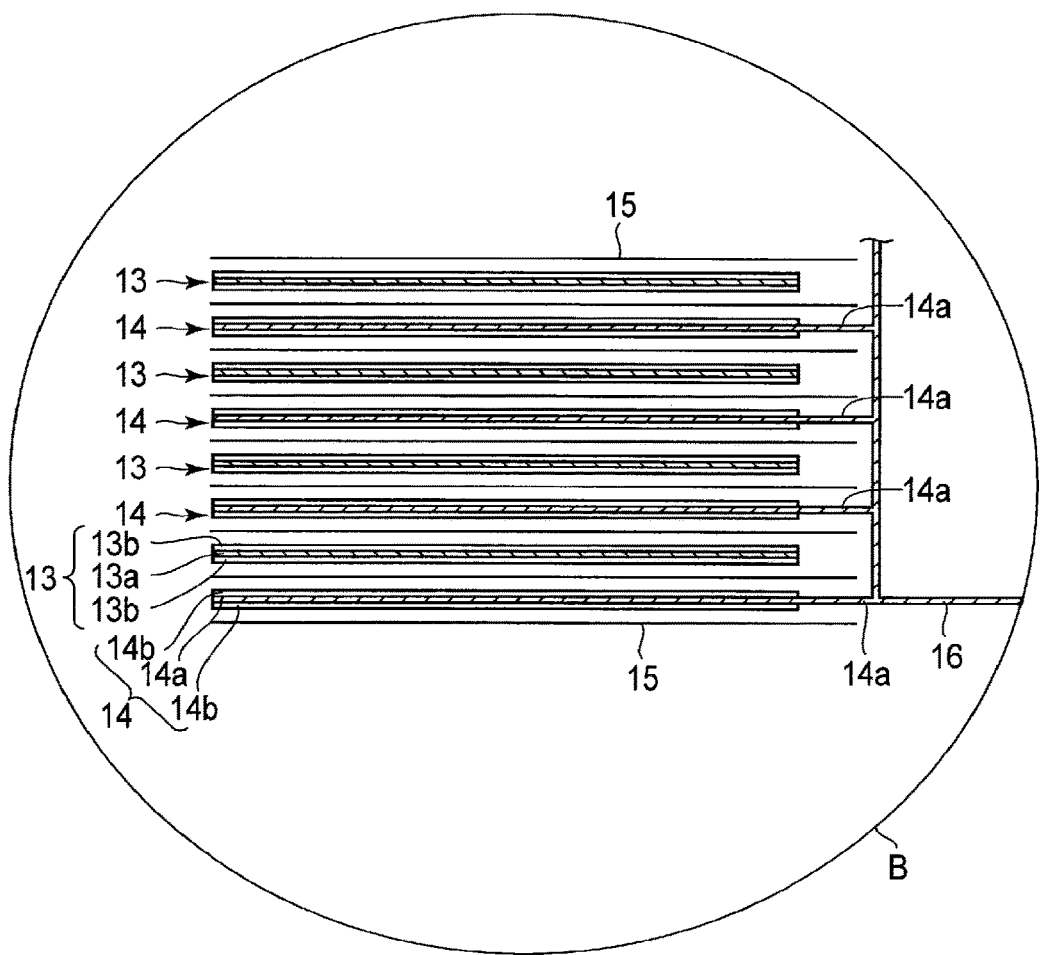
FIG. 6 is an enlarged sectional view of a B portion in FIG. 5.

The nonaqueous electrolyte battery according to the second embodiment is not limited to the nonaqueous electrolyte battery as an example shown in FIGS. 3 and 4, and may be, for example, a battery having a structure shown in FIGS. 5 and 6.

FIG. 5 is a partially cutaway perspective view schematically showing a nonaqueous electrolyte battery as another example according to the second embodiment. FIG. 6 is an enlarged cross sectional view showing a portion B in FIG. 5.

A nonaqueous electrolyte battery 10 shown in FIGS. 5 and 6 includes an electrode group 11 shown in FIGS. 5 and 6, a container member 12 shown in FIG. 5, and a nonaqueous electrolyte (not shown). The electrode group 11 and the nonaqueous electrolyte are accommodated in the container member 12. The nonaqueous electrolyte is held in the electrode group 11.

The container member 12 is made of a laminate film including two resin layers and a metal layer sandwiched between the resin layers.

As shown in FIG. 6, the electrode group 11 is a stacked electrode group. As shown in FIG. 6, the stacked electrode group 11 has a structure in which positive electrodes 13 and negative electrodes 14 are alternately laminated with a separator 15 sandwiched therebetween.

The electrode group 11 includes a plurality of positive electrodes 13. Each of the plurality of positive electrodes 13 includes a positive electrode current collector 13a, and a positive electrode layer 13b supported on each of the both surfaces of the current collector 13a. The electrode group 11 includes a plurality of negative electrodes 14. Each of the plurality of negative electrodes 14 includes a negative electrode current collector 14a, and a negative electrode layer 14b supported on each of the both surfaces of the negative electrode current collector 14a. A part of the negative electrode current collector 14a of each of the negative electrodes 14 protrudes at one side from the negative electrode 14. The protruded part of the negative electrode current collector 14a is electrically connected to a strip-shaped negative electrode terminal 16. The tip of the strip-shaped negative electrode terminal 16 is extended out from the container member 12. Although not shown in the drawings, a part of the positive electrode current collector 13a of the positive electrode 13 protrudes from the positive electrode 13 at the side opposed to the protruded side of the negative electrode current collector 14a. The protruded part of the positive electrode current collector 13a from the positive electrode 13 is electrically connected to a strip-shaped positive electrode terminal 17. The tip of the strip-shaped positive electrode terminal 17 is opposed to the negative electrode terminal 16, and extended out from a side of the container member 12.

The nonaqueous electrolyte battery according to the second embodiment contains the active material for a battery according to the first embodiment. Therefore, a nonaqueous electrolyte battery according to the second embodiment can exhibit a high charge-and-discharge capacity, a high battery voltage, and excellent life characteristics.

Third Embodiment

According to a third embodiment, there is provided a battery pack. The battery pack includes the nonaqueous electrolyte battery according to the second embodiment.

The battery pack according to the third embodiment can include one or more nonaqueous electrolyte batteries (unit cells) according to the second embodiment described above. The plurality of nonaqueous electrolyte batteries can be electrically connected in series, in parallel, or with a combination of series connection and parallel connection to constitute a battery module. The battery pack according to the third embodiment may include a plurality of battery modules.

The battery pack according to the third embodiment may further comprise a protective circuit. The protective circuit has a function to control charging and discharging of the nonaqueous electrolyte battery. Alternatively, a circuit included in an equipment where the battery pack serves as a power source (for example, electronic devices, vehicles, and the like) may be used as the protective circuit for the battery pack.

Moreover, the battery pack according to the third embodiment may further comprise an energizing external terminal (an external power distribution terminal). The energizing external terminal is configured to externally output the current from the nonaqueous electrolyte battery, and to input the current to the nonaqueous electrolyte battery. In other words, when the battery pack is used as a power source, the current is externally provided via the energizing external terminal. Also, when the battery pack is charged, the charging current (including regenerative energy caused by power of vehicles such as automobiles) is provided to the battery pack via the energizing external terminal.

Next, a battery pack as an example according to the third embodiment will be described with reference to the drawings.

FIG. 7 is an exploded perspective view of the battery pack as an example according to the third embodiment. FIG. 8 is a block diagram showing an electric circuit of the battery pack of FIG. 7.

A battery pack 20 shown in FIGS. 7 and 8 includes a plurality of unit cells 21. Each of the plurality of unit cells 21 are flat nonaqueous electrolyte battery 10 described with reference to FIGS. 3 and 4.

The plurality of unit cells 21 are stacked so that the negative electrode terminal 6 and the positive electrode terminal 7 extended outside are arranged in the same direction, and fastened with an adhesive tape 22 to constitute a battery module 23. The unit cells 21 are electrically connected to each other in series as shown in FIG. 8.

A printed wiring board 24 is arranged opposed to the side plane where the negative electrode terminal 6 and the positive electrode terminal 7 of the unit cell 21 are extended. A thermistor 25, a protective circuit 26, and an energizing terminal 27 to an external device are mounted on the printed wiring board 24 as shown in FIG. 8. An electric insulating plate (not shown) is attached to the surface of the printed wiring board 24 facing the battery module 23 to avoid unnecessary connection of the wires of the battery module 23.

A positive electrode-side lead 28 is connected to the positive electrode terminal 7 located at the bottom layer of the battery module 23 and the distal end of the lead 28 is inserted into a positive electrode-side connector 29 of the printed wiring board 24 so as to be electrically connected. An negative electrode-side lead 30 is connected to the negative electrode terminal 6 located at the top layer of the battery module 23 and the distal end of the lead 30 is inserted into an negative electrode-side connector 31 of the printed wiring board 24 so as to be electrically connected. The connectors 29 and 31 are connected to the protective circuit 26 through wirers 32 and 33 formed in the printed wiring board 24.

The thermistor 25 detects the temperature of the unit cells 21 and the detection signal is sent to the protective circuit 26. The protective circuit 26 can shut down a plus-side wirer 34a and a minus-side wirer 34b between the protective circuit 26 and the energizing terminal 27 to an external device under a predetermined condition. The predetermined condition indicates, for example, the case where the temperature detected by the thermistor 25 becomes a predetermined temperature or more. Another example of the predetermined condition indicates the case where the over-charge, over-discharge, or over-current of the unit cells 21 is detected. The detection of the over-charge and the like is performed on each of the unit cells 21 or the whole of the battery module 23. When each of the unit cells 21 is detected, the cell voltage may be detected, or positive electrode or negative electrode potential may be detected. In the case of the latter, a lithium electrode to be used as a reference electrode is inserted into each of the unit cells 21. In the case of the battery pack 20 of FIGS. 7 and 9, wirers 35 for voltage detection are connected to each of the unit cells 21. Detection signals are sent to the protective circuit 26 through the wirers 35.

Protective sheets 36 including rubber or resin are arranged on each of three side planes of the battery module 23 except the side plane from which the positive electrode terminal 7 and the negative electrode terminal 6 are protruded.

The battery module 23 is housed in a housing container 37 together with each of the protective sheets 36 and the printed wiring board 24. That is, the protective sheets 36 are arranged on both internal surfaces in a long side direction and on one internal surface in a short side direction of the housing container 37. The printed wiring board 24 is arranged on the other internal surface in a short side direction. The battery module 23 is located in a space surrounded by the protective sheets 36 and the printed wiring board 24. A lid 38 is attached to the upper surface of the housing case 37.

In order to fix the battery module 23, a heat-shrinkable tape may be used in place of the adhesive tape 22. In this case, the battery module is bound by placing the protective sheets on the both sides of the battery module, revolving the heat-shrinkable tape, and thermally shrinking the heat-shrinkable tube.

In FIGS. 7 and 8, the structure in which the unit cells 21 are connected to each other in series is shown. In order to increase the battery capacity, the unit cells may be connected to each other in parallel. Furthermore, the assembled battery packs can be connected to each other in series and/or in parallel.

The aspect of the battery pack according to the third embodiment may be appropriately changed depending on its application. The applications of the battery pack according to the third embodiment are preferably those for which cycle characteristics when large-current is taken out are desired. Specific examples of these applications include application as a battery of a digital camera and application to a vehicle such as a two- or four-wheeled hybrid electric vehicle, a two- or four-wheeled electric vehicle or a power-assisted bicycle. Particularly preferably, the battery pack according to the third embodiment is used for a battery mounted to a vehicle.

In a vehicle having the battery pack according to the third embodiment mounted, the battery pack is configured to, for example, recover regenerative energy caused by power of the vehicle. Examples of the vehicle include two to four-wheeled hybrid electric automobiles, two to four-wheeled electric automobiles, electric assist bicycles, and trains (electric train).

FIG. 9 shows an example of an automobile which includes a battery pack according to a third embodiment.

The automobile 41 shown in FIG. 9 includes a battery pack 42 which is an example of the battery pack according to the third embodiment mounted in its engine room. The mounting position is not limited to engine rooms. For example, the battery pack may also be mounted in rear parts of automobiles or under seats.

The battery pack according to the third embodiment includes the nonaqueous electrolyte battery according to the second embodiment. Therefore, a battery pack according to the third embodiment can exhibit a high charge-and-discharge capacity, a high battery voltage, and excellent life characteristics.

EXAMPLES

Hereinafter, the above embodiments are explained in more detail referring to Examples. The identification of a crystal phase and the estimation of a crystal structure of each of synthesized products was performed by powder X-ray diffraction using Cu-Kα rays. In addition, a composition of a product was analyzed by an ICP method to confirm that a target product was obtained.

Synthesis

Example 1, Example 2a, and Examples 3 to 5

In Example 1, Example 2a, and Examples 3 to 5, products of Example 1, Example 2a, and Examples 3 to 5 are eacsynthesized by the following procedure. The target composition of each of Example 1, Example 2a, and Examples 3 to h 5 is shown in Table 1 above.

First, commercially available oxide and carbonate reagents shown in Table 1 are provided as starting materials such that the molar ratio similarly shown in Table 1 was satisfied and the total of weights was 50 g.

Next, the starting materials provided as described above were mixed to obtain mixture and the mixture was put into an agate pod for ball mill (a volume: 300 ml). Agate balls having diameters of 10 mm and 5 mm were each put into the pod in a ratio of 1:1 to occupy ⅓ of the pod volume. Then, 50 ml of ethanol was poured into the pod, and the mixture was wet-mixed at 120 rpm for 60 min to obtain a mixture. The materials are uniformly mixed by the wet-mixing and thus, the single phase of the intended crystal phase can be obtained.

Next, the mixture thus obtained was put into an electric furnace, and a heat treatment of the mixture was performed by the following procedure.

First, the mixture was subjected to calcination in an air atmosphere at 650° C. for six hours. Next, a powder obtained by the calcination was taken out of the furnace, re-ground and further mixed. When the calcination is previously performed as above to decompose the carbonates or the like in the raw materials and they are mixed again, the raw material particles can cohere to each other in a main sintering; as a result, particles which are uniform and have high crystallinity can be obtained.

The mixture thus obtained was subsequently subjected to a first-sintering at 900° C. for six hours. After the sintering, sintered powder was taken out of the furnace and next, the sintered powder taken out of the furnace was re-mixed.

Subsequently, the re-mixed sintered powder was put into the furnace, and then, in the furnace, a second sintering was performed in an air atmosphere at 1400° C. for 1 hour. Then, to obtain a stable crystal phase at a high temperature, sintered powder was input into liquid nitrogen from the furnace at 1400° C. to cool rapidly. The temperature of the sintered powder was cooled by 1300° C. in three seconds after starting to cool. The powder obtained by cooling in liquid nitrogen after the second sintering, that is, sintering at 1400° C. for 1 hour was referred to a product of each of Example 1, Example 2a, and Examples 3 to 5.

Example 2b

In Example 2b, product of Example 2b were synthesized by the following procedure using the composition shown in Table 1 as the target composition.

TABLE 1

|  | Target Composition | Li Source/ Amount | Na Source/ Amount | M1 Source/ Amount | Ti Source/ Amount | M2 Source/ Amount |
| --- | --- | --- | --- | --- | --- | --- |
| Example 1 | $Na_{3.9}Ti_{5.9}Nb_{0.1}O_{14}$ | — | $Na_2CO_3$/1.9 | — | $TiO_2$/5.9 | $Nb_2O_5$/0.05 |
| Example 2a | $Na_3Ti_5NbO_{14}$ | — | $Na_2CO_3$/1.5 | — | $TiO_2$/5.0 | $Nb_2O_5$/0.5 |
| Example 2b | $Li_{5.9}Na_3Ti_5NbO_{14}$ | Electro-chemically insertion | — | — | — | — |
| Example 3 | $Na_2Ti_4Nb_2O_{14}$ | — | $Na_2CO_3$/1.0 | — | $TiO_2$/4.0 | $Nb_2O_5$/1.0 |
| Example 4 | $NaTi_3Nb_3O_{14}$ | — | $Na_2CO_3$/0.5 | — | $TiO_2$/3.0 | $Nb_2O_5$/1.5 |
| Example 5 | $Na_{0.1}Ti_{2.1}Nb_{3.9}O_{14}$ | — | $Na_2CO_3$/0.05 | — | $TiO_2$/2.10 | $Nb_2O_5$/1.95 |

First, a portion of the product obtained in Example 2a was taken out and subjected to grinding so that the average particle size (D50) become 5 μm or less to obtain ground product. Next, acetylene black as a conductive agent was mixed with the ground product in a ratio of 10 parts by mass to the ground product to obtain a mixture. Next, the mixture was dispersed in NMP (N-methyl-2-pyrrolidone) to obtain dispersion. Polyvinylidene difluoride (PVdF) as a binder was mixed with the dispersion in a ratio of 10 parts by mass to the ground product of the product in Example 2a to produce an electrode slurry. The slurry was applied onto a current collector made of aluminum foil using a blade. The current collector was dried in a vacuum at 130° C. for 12 hours and then, rolled so that the density of the electrode layer (excluding the current collector) was 2.2 g/cm$^3$ to obtain an electrode.

This electrode, metal lithium foil as a counter electrode, and a nonaqueous electrolyte were used to produce an electrochemical lithium-insertion cell. As the nonaqueous electrolyte, a nonaqueous electrolyte which was prepared by dissolving lithium hexafluorophosphate (LiPF$_6$) in a mixed solvent (volume ratio 1:1) of ethylene carbonate and diethyl carbonate in the concentration of 1 M was used.

The lithium-insertion cell was subjected to Li insertion at constant voltage in which the potential with respect to metal lithium was set to 1.0 V for 12 hours. In this manner, Li ions were electrochemically inserted into the product in Example 2a.

Next, the electrode into which Li ions have been inserted was taken out of the cell under an argon atmosphere, cleaned using ethyl methyl carbonate, and then dried under reduced pressure, and housed in a closed film of aluminum laminate. Hereinafter, the electrode was handled in an argon atmosphere or a vacuum without being exposed to an air atmosphere when the electrode was subjected to each analysis.

Thus, a product of Example 2b were obtained.

Examples 6 to 8 in Table 2 was satisfied and the total of weights was 50 g. Next, the starting materials provided as described above were mixed to obtain mixture and the mixture was put into an agate pod for ball mill (a volume: 300 ml). Agate balls having the diameters of 10 mm and 5 mm were each put into the pod in a ratio of 1:1 to occupy ⅓ of the pod volume. Then, 50 ml of ethanol was poured into the pod, the mixture was wet-mixed at 120 rpm for 60 min to obtain a mixture. The materials are uniformly mixed by the wet-mixing and thus, the single phase of the intended crystal phase can be obtained.

Next, the mixture thus obtained was put into an electric furnace, and a heat treatment of the mixture was performed by the following procedure.

First, the mixture was calcined at 650° C. for 6 hours. Next, the powder obtained by the calcination was taken out of the furnace, re-ground and further mixed. When the calcination is previously performed as above to decompose the carbonates or the like in the raw materials and they are mixed again, the raw material particles can cohere to each other in a main sintering; as a result, particles which are uniform and have high crystallinity can be obtained.

The mixture thus obtained was subsequently subjected to a first-sintering at 1100° C. for six hours. After the sintering, sintered powder was taken out of the furnace and the sintered powder was re-mixed.

Subsequently, the re-mixed sintered powder was put into the furnace, and then, in the furnace, a second sintering was performed in an air atmosphere at 1100° C. for 6 hours. The powder obtained after the second sintering, that is, sintering at 1100° C. for 12 hours was used as a precursor in Example 6.

Next, the precursor in Example 6 was put into solution of sulfuric acid in water having a concentration of 1.0 mol/L, and the precursor was allowed to react with sulfuric acid

TABLE 2

| | Target Composition | Li Source/ Amount | Na Source/ Amount | M1 Source/ Amount | Ti Source/ Amount | M2 Source/ Amount |
|---|---|---|---|---|---|---|
| Example 6 (Precursor) | $Rb_3Ti_5NbO_{14}$ | — | — | $Rb_2CO_3$/3.0 | $TiO_2$/5.0 | $Nb_2O_5$/0.5 |
| Example 6 (Product) | $Na_{2.75}Rb_{0.20}H_{0.05}Ti_5NbO_{14}$ | — | Na$^+$ Exchange | H$^+$ Exchange | — | — |
| Example 7 (Precursor) | $Cs_3Ti_5NbO_{14}$ | — | — | $Cs_2CO_3$/3.0 | $TiO_2$/5.0 | $Nb_2O_5$/0.5 |
| Example 7a (Product) | $Na_{2.75}Cs_{0.20}H_{0.05}Ti_6NbO_{14}$ | — | Na$^+$ Exchange | H$^+$ Exchange | — | — |
| Example 7b (Product) | $Na_{2.95}H_{0.05}Ti_5NbO_{14}$ | — | Na$^+$ Exchange | H$^+$ Exchange | — | — |
| Example 7c (Product) | $Na_3Ti_5NbO_{14}$ | — | Na$^+$ Exchange | — | — | — |
| Example 8 (Precursor) | $K_3Ti_5NbO_{14}$ | — | — | $K_2CO_3$/3.0 | $TiO_2$/5.0 | $Nb_2O_5$/0.5 |
| Example 8a (Product) | $Na_{2.10}K_{0.85}H_{0.05}Ti_5NbO_{14}$ | — | Na$^+$ Exchange | H$^+$ Exchange | — | — |
| Example 8b (Product) | $Na_{2.75}K_{0.20}H_{0.05}Ti_5NbO_{14}$ | — | Na$^+$ Exchange | H$^+$ Exchange | — | — |

Example 6

In Example 6, a product of Example 6 were synthesized by the following procedure. The target composition of Example 6 is shown in the column of "(Products)" in Table 2 above.

First, commercially available oxide and carbonate reagents shown in Table 2 were provided as starting materials to synthesize a precursor having the target composition shown in Table 2 such that the molar ratio similarly shown solution at 60° C. for seven days while stirring the solution so as to carry out proton-exchange. The sulfuric acid solution was replaced every day. Next, the proton-exchanged product thus obtained was immersed in solution of sodium nitrate in water having a concentration of 1.0 mol/L, and the proton-exchanged product was allowed to react with sodium nitrate solution at 60° C. for 14 days while similarly stirring the solution. Product thus obtained were subjected to filtration, and then, the obtained residue was cleaned using ion-exchanged water. Next, the cleaned product was dried at 140° C. for 12 hours. In this manner, product of Example 6 was obtained.

Example 7

In Example 7, products in each of Examples 7a to 7c were synthesized by the following procedure. The target composition of each of Examples 7a to 7c was shown in the column of "(Products)" in Table 2 above.

First, commercially available oxide and carbonate reagents shown in Table 2 are provided as starting materials to synthesize a precursor of the target composition shown in Table 2 such that the molar ratio similarly shown in Table 2 was satisfied and the total of weights was 50 g. A precursor of Example 7 was obtained by a procedure similar to that in Example 6 except that these starting materials were used. Next, the precursor of Example 7 was divided into three portions.

One of three portions of the precursor was put into solution of sulfuric acid in water having a concentration of 1.0 mol/L, and the precursor was allowed to react with sulfuric acid solution at 60° C. for seven days while stirring the solution so as to carry out proton-exchange. The sulfuric acid solution was replaced every day. Next, the proton-exchanged product thus obtained was immersed in solution of sodium nitrate in water having a concentration of 1.0 mol/L, and the proton-exchanged product was allowed to react with sodium nitrate solution at 60° C. for 14 days while similarly stirring the solution. Product thus obtained was subjected to filtration, and then, the obtained residue was cleaned using ion-exchanged water. Next, the cleaned product was dried at 140° C. for 12 hours. In this manner, product of Example 7a was obtained.

Another one of the three portions of the precursor was subjected to a procedure similar to that in Example 7a except that proton exchange using a sodium nitrate solution was performed for 14 days, to obtain product of Example 7b.

Example 8

In Example 8, products in each of Examples 8a and 8b were synthesized by the following procedure. The target composition in each of Examples 8a and 8b is shown in the column of "(Products)" in Table 2 above.

First, commercially available oxide and carbonate reagents were provided as starting materials to synthesize a precursor of the target composition shown in Table 2 such that the molar ratio similarly shown in Table 2 was satisfied and the total of weights was 50 g. A precursor of Example 8 was obtained by a procedure similar to that in Example 6 except that these starting materials were used. Next, the precursor of Example 8 was divided into two portions.

One of two portions of the precursor was put into solution of sulfuric acid in water having a concentration of 1.0 mol/L, and the precursor was allowed to react with sulfuric acid solution at 60° C. for seven days while stirring the solution so as to carry out proton-exchange. The sulfuric acid solution was replaced every day. Next, the proton-exchanged product thus obtained was immersed in solution of sodium nitrate in water having a concentration of 1.0 mol/L, and the proton-exchanged product was allowed to react with sodium nitrate solution at 60° C. for 14 days while similarly stirring the solution. Product thus obtained were subjected to filtration, and then, the obtained residue was cleaned using ion-exchanged water. Next, the cleaned product was dried at 140° C. for 12 hours. In this manner, product of Example 8a was obtained.

The other one of the two portions of the precursor was subjected to a procedure similar to that in Example 8a except that proton exchange using a sodium nitrate solution was performed for 14 days, to obtain product of Example 8b Examples 9 to 18

TABLE 3

| | Target Composition | Li Source/ Amount | Na Source/ Amount | M1 Source/ Amount | Ti Source/ Amount | M2 Source/ Amount |
|---|---|---|---|---|---|---|
| Example 9 | $Na_2Ti_4Nb_{1.9}Ta_{0.1}O_{14}$ | — | $Na_2CO_3/1.0$ | — | $TiO_2/4.0$ | $Nb_2O_5/0.95$ $Ta_2O_5/0.05$ |
| Example 10 | $Na_2Ti_4Nb_{1.9}V_{0.1}O_{14}$ | — | $Na_2CO_3/1.0$ | — | $TiO_2/4.0$ | $Nb_2O_5/0.95$ $V_2O_5/0.05$ |
| Example 11 | $Na_{1.9}Ti_4Nb_{1.9}Mo_{0.1}O_{14}$ | — | $Na_2CO_3/0.95$ | — | $TiO_2/4.0$ | $Nb_2O_5/0.95$ $MoO_3/0.05$ |
| Example 12 | $Na_{1.9}Ti_4Nb_{1.9}W_{0.1}O_{14}$ | — | $Na_2CO_3/0.95$ | — | $TiO_2/4.0$ | $Nb_2O_5/0.95$ $WO_3/0.05$ |
| Example 13 | $Na_2Ti_{3.9}Zr_{0.1}Nb_{2.0}O_{14}$ | — | $Na_2CO_3/1.0$ | — | $TiO_2/3.9$ | $Nb_2O_5/1.0$ $ZrO_2/0.1$ |
| Example 14 | $Na_2Ti_{3.9}Sn_{0.1}Nb_{2.0}O_{14}$ | — | $Na_2CO_3/1.0$ | — | $TiO_2/3.9$ | $Nb_2O_5/1.0$ $SnO_2/0.1$ |
| Example 15 | $Li_{0.1}Na_2Ti_{3.9}Fe_{0.1}Nb_{2.0}O_{14}$ | $Li_2CO_3/0.05$ | $Na_2CO_3/1.0$ | — | $TiO_2/3.9$ | $Nb_2O_5/1.0$ $Fe_2O_3/0.05$ |
| Example 16 | $Li_{0.1}Na_2Ti_{3.9}Co_{0.1}Nb_{2.0}O_{14}$ | $Li_2CO_3/0.05$ | $Na_2CO_3/1.0$ | — | $TiO_2/3.9$ | $Nb_2O_5/1.0$ $Co_2O_3/0.05$ |
| Example 17 | $Li_{0.1}Na_2Ti_{3.9}Mn_{0.1}Nb_{2.0}O_{14}$ | $Li_2CO_3/0.05$ | $Na_2CO_3/1.0$ | — | $TiO_2/3.9$ | $Nb_2O_5/1.0$ $Mn_2O_3/0.05$ |
| Example 18 | $Li_{0.1}Na_2Ti_{3.9}Al_{0.1}Nb_{2.0}O_{14}$ | $Li_2CO_3/0.05$ | $Na_2CO_3/1.0$ | — | $TiO_2/3.9$ | $Nb_2O_5/1.0$ $Al_2O_3/0.05$ |

The last one of the three portions of the precursor was subjected to a procedure similar to that in Example 7a except that sodium-ion exchange was directly performed in molten salt melted by heating sodium nitrate up to 320° C. for 12 hours and then cleaning was performed using ion-exchanged water, to obtain product in Example 7c.

In Examples 9 to 18, products of each of Examples 9 to 18 was synthesized by preparing starting materials shown in Table 3 above to synthesize products having the target composition shown in Table 3 by a procedure similar to that in Example 1 except that these starting materials were used.

Comparative Examples 1 to 3

TABLE 4

|  | Target Composition | Li Source/ Amount | Na Source/ Amount | M1 Source/ Amount | Ti Source/ Amount | M2 Source/ Amount |
|---|---|---|---|---|---|---|
| Comparative Example 1 | $Li_2Na_2Ti_6O_{14}$ | $Li_2CO_3$/1.0 | $Na_2CO_3$/1.0 | — | $TiO_2$/6.0 | — |
| Comparative Example 2 | $Li_2Na_{1.75}Ti_{5.75}Nb_{0.25}O_{14}$ | $Li_2CO_3$/1.0 | $Na_2CO_3$/0.875 | — | $TiO_2$/5.75 | $Nb_2O_5$/0.125 |
| Comparative Example 3 | $Nb_4Ti_2O_{14}$ ($Nb_2TiO_7$) | — | — | — | $TiO_2$/1.0 | $Nb_2O_5$/1.0 |

Comparative Examples 1 and 2

In Comparative Examples 1 and 2, product of each of Comparative Examples 1 and 2 was synthesized by the following procedure. The target composition of each of Comparative Examples 1 and 2 is shown in Table 4 above.

First, commercially available oxide and carbonate reagents shown in Table 4 above were provided as starting materials such that the molar ratio similarly shown in Table 4 was satisfied and the total of weights was 50 g. Next, the starting materials provided as described above were mixed to obtain mixture and mixture was put into an agate pod for ball mill (a volume: 300 ml). Agate balls having the diameters of 10 mm and 5 mm were each put into the pod in a ratio of 1:1 to occupy ⅓ of the pod volume. Then, 50 ml of ethanol was poured into the pod, the mixture was wet-mixed at 120 rpm for 60 min to obtain a mixture. The materials were uniformly mixed by the wet-mixing and thus, the single phase of the intended crystal phase can be obtained.

Next, the mixture thus obtained was put into an electric furnace, and a heat treatment of the mixture was performed by the following procedure.

First, the mixture was calcined at 650° C. for 6 hours. Next, the powder obtained by the calcination was taken out of the furnace, re-ground and further mixed. When the calcination is previously performed as above to decompose the carbonates or the like in the raw materials and they are mixed again, the raw material particles can cohere to each other in a main sintering; as a result, particles which are uniform and have high crystallinity can be obtained. The mixture thus obtained was subsequently subjected to a sintering at 900° C. for six hours. In this manner, products in each of Comparative Examples 1 and 2 are synthesized.

Comparative Example 3

In Comparative Example 3, product of Comparative Example 3 was synthesized by a procedure similar to that in Comparative Examples 1 and 2 except that the temperature of main-sintering was set to 1100° C.

(Confirmation of Composition of Product)

The composition of each of Examples 1 to 18 and Comparative Examples 1 to 3 was analyzed by the ICP method described above. Also, the composition of the precursor of each of Examples 6 to 8 was similarly analyzed. These results are shown in Table 5 below.

TABLE 5

| | | $Li_wNa_{4-x}M1_yTi_{6-z}M2_zO_{14}$ | | | |
|---|---|---|---|---|---|
| | Composition | w | x | y | z |
| Comparative Example 1 | $Li_2Na_2Ti_6O_{14}$ | 2 | 2 | 0 | 0 |
| Comparative Example 2 | $Li_2Na_{1.75}Ti_{5.75}Nb_{0.25}O_{14}$ | 2 | 2.25 | 0.25 | 0.25 |
| Comparative Example 3 | $Nb_4Ti_2O_{14}$ ($Nb_2TiO_7$) | 0 | 4 | 0 | 4 |
| Example 1 | $Na_{3.9}Ti_{5.9}Nb_{0.1}O_{14}$ | 0 | 0.1 | 0 | 0.1 |
| Example 2a | $Na_3Ti_5NbO_{14}$ | 0 | 1.0 | 0 | 1.0 |
| Example 2b | $Li_{5.9}Na_3Ti_5NbO_{14}$ | 5.9 | 1.0 | 0 | 1.0 |
| Example 3 | $Na_2Ti_4Nb_2O_{14}$ | 0 | 2.0 | 0 | 2.0 |
| Example 4 | $NaTi_3Nb_3O_{14}$ | 0 | 3.0 | 0 | 3.0 |
| Example 5 | $Na_{0.1}Ti_{2.1}Nb_{3.9}O_{14}$ | 0 | 3.9 | 0 | 3.9 |
| Example 6 (Precursor) | $Rb_3Ti_5NbO_{14}$ | — | — | — | — |
| Example 6 (Product) | $Na_{2.75}Rb_{0.20}H_{0.05}Ti_5NbO_{14}$ | 0 | 1.25 | 0.25 | 1.0 |
| Example 7 (Precursor) | $Cs_3Ti_5NbO_{14}$ | — | — | — | — |
| Example 7a (Product) | $Na_{2.75}Cs_{0.20}H_{0.05}Ti_5NbO_{14}$ | 0 | 1.25 | 0.25 | 1.0 |
| Example 7b (Product) | $Na_{2.95}H_{0.05}Ti_5NbO_{14}$ | 0 | 1.05 | 0.05 | 1.0 |
| Example 7c (Product) | $Na_3Ti_5NbO_{14}$ | 0 | 1.0 | 0 | 1.0 |
| Example 8 (Precursor) | $K_3Ti_5NbO_{14}$ | — | — | — | — |
| Example 8a (Product) | $Na_{2.10}K_{0.85}H_{0.05}Ti_5NbO_{14}$ | 0 | 1.90 | 0.9 | 1.0 |
| Example 8b (Product) | $Na_{2.75}K_{0.20}H_{0.05}Ti_5NbO_{14}$ | 0 | 1.25 | 0.25 | 1.0 |
| Example 9 | $Na_2Ti_4Nb_{1.9}Ta_{0.1}O_{14}$ | 0 | 2.0 | 0 | 2.0 |
| Example 10 | $Na_2Ti_4Nb_{1.9}V_{0.1}O_{14}$ | 0 | 2.0 | 0 | 2.0 |
| Example 11 | $Na_{1.9}Ti_4Nb_{1.9}Mo_{0.1}O_{14}$ | 0 | 2.1 | 0 | 2.0 |
| Example 12 | $Na_{1.9}Ti_4Nb_{1.9}W_{0.1}O_{14}$ | 0 | 2.1 | 0 | 2.0 |
| Example 13 | $Na_2Ti_{3.9}Zr_{0.1}Nb_{2.0}O_{14}$ | 0 | 2.0 | 0 | 2.1 |
| Example 14 | $Na_2Ti_{3.9}Sn_{0.1}Nb_{2.0}O_{14}$ | 0 | 2.0 | 0 | 2.1 |
| Example 15 | $Li_{0.1}Na_2Ti_{3.9}Fe_{0.1}Nb_{2.0}O_{14}$ | 0.1 | 2.0 | 0 | 2.1 |
| Example 16 | $Li_{0.1}Na_2Ti_{3.9}Co_{0.1}Nb_{2.0}O_{14}$ | 0.1 | 2.0 | 0 | 2.1 |
| Example 17 | $Li_{0.1}Na_2Ti_{3.9}Mn_{0.1}Nb_{2.0}O_{14}$ | 0.1 | 2.0 | 0 | 2.1 |
| Example 18 | $Li_{0.1}Na_2Ti_{3.9}Al_{0.1}Nb_{2.0}O_{14}$ | 0.1 | 2.0 | 0 | 2.1 |

(Powder X-Ray Diffraction Measurement)

Powder X-ray diffraction (XRD) measurement of each of the products synthesized in Examples and Comparative Examples described above was performed by the procedure described above. The crystal structure of each product was analyzed by the Rietveld method from results of the powder X-ray diffraction measurement obtained after the particle size distributions of the products being adjusted. Also, crystallinity of each product was estimated from the XRD peak line width. Analysis results of the space group, lattice constant, unit lattice volume and the like for each product were summarized in Table 6 below.

electrodes situated on the top of a piston and on the bottom of a cylinder. Each electrode had a radius of 10 mm. The

TABLE 6

| | Composition | Crystal Phase | Space Group | Lattice Constant | | | Volume | Crystal Water | Synthesis Method | Crystal-linity |
|---|---|---|---|---|---|---|---|---|---|---|
| | | | | a | b | c | V [Å³] | n H₂O | | |
| Comparative Example 1 | $Li_2Na_2Ti_6O_{14}$ | Orthorhombic | Fmmm | 16.38 | 5.76 | 11.30 | 1066.14 | Non | SP | Medium-Low |
| Comparative Example 2 | $Li_2Na_{1.75}Ti_{5.75}Nb_{0.25}O_{14}$ | Orthorhombic | Fmmm | 16.51 | 5.75 | 11.16 | 1059.45 | Non | SP | Medium-Low |
| Comparative Example 3 | $Nb_4Ti_2O_{14}$ ($Nb_2TiO_7$) | Monoclinic | C2/m | 19.93 | 3.81 | 20.44 | 1552.08 | Non | SP | Medium-Low |
| Example 1 | $Na_{3.9}Ti_{5.9}Nb_{0.1}O_{14}$ | Monoclinic | C2/m | 17.14 | 3.80 | 9.14 | 595.30 | Non | SP and RC | Medium |
| Example 2a | $Na_3Ti_5NbO_{14}$ | Monoclinic | C2/m | 18.24 | 3.78 | 9.18 | 632.94 | Non | SP and RC | Medium |
| Example 2b | $Li_{5.9}Na_3Ti_5NbO_{14}$ | Monoclinic | C2/m | 18.42 | 3.76 | 9.36 | 648.52 | Non | Electro-chemical Method | Medium |
| Example 3 | $Na_2Ti_4Nb_2O_{14}$ | Monoclinic | C2/m | 15.32 | 3.75 | 9.16 | 526.24 | Non | SP and RC | Medium |
| Example 4 | $NaTi_3Nb_3O_{14}$ | Monoclinic | Cm | 15.13 | 3.74 | 9.13 | 516.63 | Non | SP and RC | Medium |
| Example 5 | $Na_{0.1}Ti_{2.1}Nb_{3.9}O_{14}$ | Monoclinic | C2/m | 19.89 | 3.79 | 20.12 | 1516.71 | Non | SP and RC | Medium |
| Example 6 | $Na_{2.75}Rb_{0.20}H_{0.05}Ti_5O_{14}$ | Monoclinic | C2/m, C2, Cm | 20.30 | 3.76 | 9.42 | 719.00 | n = 1 | H⁺ Exchange | Low |
| Example 7a | $Na_{2.75}Cs_{0.20}H_{0.05}Ti_5NbO_{14}$ | Monoclinic | C2/m, C2, Cm | 20.22 | 3.77 | 9.40 | 716.56 | n = 1 | H⁺ Exchange | Low |
| Example 7b | $Na_{2.95}H_{0.05}Ti_5NbO_{14}$ | Monociinic | C2/m, C2, Cm | 19.95 | 3.78 | 9.38 | 632.94 | n = 1 | H⁺ Exchange | Low |
| Example 7c | $Na_3Ti_5NbO_{14}$ | Monoclinic | C2/m | 18.42 | 3.78 | 9.21 | 641.27 | Non | Using Molten Salt | High |
| Example 8a | $Na_{2.10}K_{0.85}H_{0.05}Ti_5NbO_{14}$ | Monoclinic | C2/m, C2, Cm | 19.15 | 3.77 | 9.30 | 671.42 | n = 1 | H⁺ Exchange | Low |
| Example 8b | $Na_{2.75}K_{0.20}H_{0.05}Ti_5NbO_{14}$ | Monoclinic | C2/m, C2, Cm | 18.82 | 3.76 | 9.27 | 655.97 | n = 1 | H⁺ Exchange | Low |
| Example 9 | $Na_2Ti_4Nb_{1.9}Ta_{0.1}O_{14}$ | Monoclinic | C2/m | 15.31 | 3.75 | 9.15 | 525.32 | Non | SP and RC | Medium |
| Example 10 | $Na_2Ti_4Nb_{1.9}V_{0.1}O_{14}$ | Monoclinic | C2/m | 15.31 | 3.74 | 9.16 | 524.49 | Non | SP and RC | High |
| Example 11 | $Na_{1.9}Ti_4Nb_{1.9}Mo_{0.1}O_{14}$ | Monoclinic | C2/m | 15.33 | 3.75 | 9.17 | 527.16 | Non | SP and RC | High |
| Example 12 | $Na_{1.9}Ti_4Nb_{1.9}W_{0.1}O_{14}$ | Monoclinic | C2/m | 15.32 | 3.76 | 9.16 | 527.65 | Non | SP and RC | Medium |
| Example 13 | $Na_2Ti_{3.9}Zr_{0.1}Nb_{2.0}O_{14}$ | Monoclinic | C2/m | 15.31 | 3.74 | 9.15 | 523.92 | Non | SP and RC | Medium |
| Example 14 | $Na_2Ti_{3.9}Sn_{0.1}Nb_{2.0}O_{14}$ | Monoclinic | C2/m | 15.32 | 3.75 | 9.15 | 525.67 | Non | SP and RC | High |
| Example 15 | $Li_{0.1}Na_2Ti_{3.9}Fe_{0.1}Nb_{2.0}O_{14}$ | Monoclinic | C2/m | 15.30 | 3.74 | 9.14 | 523.00 | Non | SP and RC | Medium |
| Example 16 | $Li_{0.1}Na_2Ti_{3.9}Co_{0.1}Nb_{2.0}O_{14}$ | Monoclinic | C2/m | 15.31 | 3.76 | 9.15 | 525.66 | Non | SP and RC | Medium |
| Example 17 | $Li_{0.1}Na_2Ti_{3.9}Mn_{0.1}Nb_{2.0}O_{14}$ | Monoclinic | C2/m | 15.32 | 3.75 | 9.15 | 525.66 | Non | SP and RC | Medium |
| Example 18 | $Li_{0.1}Na_2Ti_{3.9}Al_{0.1}Nb_{2.0}O_{14}$ | Monoclinic | C2/m | 15.30 | 3.73 | 9.14 | 521.61 | Non | SP and RC | Medium |

*SP: Solid Phase Reaction Method; SP and RC: Solid Phase Reaction Method and Rapid Cooling From the results shown in Table 6, it is clear that products obtained from Examples 1 to 5, Example 7a, and Examples 9 to 18 are compounds having a monoclinic crystal structure with symmetry belonging to the space group C2/m described with reference to FIGS. 1 and 2.

Also from the results shown in Table 6, it is clear that protons or crystal water is contained in the crystal structure in each product of Example 6, Examples 7a and 7b, and Examples 8a and 8b which was obtained via proton exchange. The quantity of water in the general formula contained in the structure as crystal water is shown as n in Table 6. These compounds obtained via the proton exchange method exhibited, as shown in Table 6, low crystallinity under the influence of crystal water and a wide peak width of XRD measurement. Thus, these products can be determined to be compounds with symmetry belonging to one of C2/m, C/2, and Cm, but the symmetry thereof cannot be identified.

In other words, as shown in Table 6, the product of each example is all compounds having a monoclinic crystal structure. On the other hand, the products in Comparative Examples 1 and 2 are orthorhombic compounds with symmetry belonging to the space group Fmmm as shown in Table 6. Also, the product of Comparative Example 3 is compounds having a monoclinic crystal structure.

(Measurement of Powder Resistance)

The powder resistance of each product obtained from the above Examples and Comparative Examples was measured by the following procedure. First, each sample was ground such that the average particle size (D50) is 5 μm or less. Next, 3 g of ground products was put into a cylinder with counter electrodes. The sample was arranged between two electrodes situated on the top of a piston and on the bottom of a cylinder. Each electrode had a radius of 10 mm. The volume resistivity was measured in this state by applying the pressure of 20 kgN to the sample. The resistance was measured by setting the applied voltage to 10 V and the volume resistivity (Ωcm) was calculated from the thickness and the diameter of the electrode.

The powder resistance of each product was evaluated by setting the numerical value of the volume resistivity of Comparative Example 1 as "medium", referring examples each regarding product whose volume resistivity was lower than that of Comparative Example 1 by 10% or more as "low", conversely referring examples each regarding product whose volume resistivity was higher by 10% or more as "high", and referring examples regarding other products as "medium", and the results of the evaluation are summarized in Table 7 below.

(Electrochemical Measurements)

The products obtained from the above Examples and Comparative Examples were subjected to electrochemical measurement according to the following procedure.

First, a electrochemical measurement cell for each of Examples and Comparative Examples was produced by the following procedure. An example using the product of Example 1 is described below, but electrochemical measurement for each product of other Examples and Comparative Examples was similarly made to for the product of Example 1.

First, particles of the product in Example 1 were subjected to grinding so that the average particle size become 5 μm or less to obtain ground product. Next, acetylene black as a conductive agent was mixed with the ground product in a ratio of 10 parts by mass to the ground product to obtain a mixture. Next, the mixture was dispersed in NMP (N-methyl-2-pyrrolidone) to obtain dispersion. Polyvinylidene difluoride (PVdF) as a binder was mixed with the dispersion in a ratio of 10 parts by mass to the product in Example 1 to produce an electrode slurry. The slurry was applied onto one side of a current collector made of aluminum foil using a blade. The current collector was dried in a vacuum at 130° C. for 12 hours and then, rolled so that the density of the electrode layer (excluding the current collector) was 2.2 g/cm$^3$ to obtain an electrode.

This electrode, metal lithium foil as a counter electrode, and a nonaqueous electrolyte were used to produce electrochemical measurement cells in Example 1. As the nonaqueous electrolyte, a nonaqueous electrolute prepared by dissolving lithium hexafluorophosphate (LiPF$_6$) in a mixed solvent (volume ratio 1:1) of ethylene carbonate and diethyl carbonate in the concentration of 1 M was used.

The electrochemical measurement cell of each of Examples and Comparative Examples was subjected to a charge-and-discharge test at room temperature. The charge-and-discharge test was performed within a potential range of 1.0 V to 3.0 V with reference to the metal lithium electrode at a charge-and-discharge current value of 0.2 C (hourly discharge rate). In this test, a first Li insertion amount was defined as an initial charge capacity, and a first Li extraction amount was defined as an initial discharge capacity. At this time, a value obtained by dividing an initial discharge capacity by the initial charge capacity, and multiplying the obtained value by 100 (initial discharge capacity/initial charge capacity×100) was defined as an initial charge-and-discharge efficiency.

Next, in order to confirm whether or not the product of Example 1 can be stably charged and discharged, the electrochemical measurement cell of Example 1 was repeatedly subjected to 50 cycles of charge and discharge. One cycle consisted of one charge and one discharge. Between the charge and the discharge, the rest was performed for 10 minutes. The charge and discharge were performed at room temperature within a potential range of 1.0 V to 3.0 V with reference to the metal lithium electrode at a current value of 1 C (hourly discharge rate).

In order to confirm the discharge capacity retention ratio after 50 cycles, the electrochemical measurement cell of Example 1 was charged and discharged again at 0.2 C (hourly discharge rate), and the capacity retention ratio was calculated with the initial discharge capacity defined as 100%.

Also, a 0.2 C discharge capacity and a 5.0 C discharge capacity of the electrochemical measurement cell of Example 1 were measured. By dividing the 5.0 C discharge capacity obtained by measurement by the 0.2 C capacity obtained similarly by measurement, the discharge rate as an index of rate performance was calculated.

Furthermore, the electrochemical measurement cell of Example 1 was put into a completely discharged (Li extracted) state. Next, the electrochemical measurement cell was charged (Li inserted) at 0.2 C up to 50% of the capacity. Next, the electrochemical measurement cell was put into an open-circuit state and left alone in this state for 1 hour. After being left alone, the electrode potential of the electrochemical measurement cell was measured. The electrode potential was defined as a potential (V vs. Li/Li$^+$) at SOC 50%.

The initial discharge capacity, initial charge-and-discharge efficiency, 5 C/0.2 C discharge capacity ratio, capacity retention ratio after 50 cycles, and potential at SOC 50% of the electrochemical measurement cell of each of Examples and Comparative Examples obtained from the above electrochemical measurements are shown in Table 7 below.

TABLE 7

| | Composition | Powder Resistance | Initial Discharge Capacity (mAh/g) | Initial Charge-Discharge Efficiency (%) | 5 C/0.2 C: Ratio of Discharge Capacity (%) | Capacity Retention Ratio after 50 cycles (%) | Potential at SOC 50% (V vs. Li$^+$/Li) |
|---|---|---|---|---|---|---|---|
| Comparative Example 1 | $Li_2Na_2Ti_6O_{14}$ | Medium | 90.8 | 89.0 | 89.5 | 80.5 | 1.28 |
| Comparative Example 2 | $Li_2Na_{1.75}Ti_{5.75}Nb_{0.25}O_{14}$ | Medium | 115.9 | 90.5 | 90.7 | 86.8 | 1.30 |
| Comparative Example 3 | $Nb_4Ti_2O_{14}$ ($Nb_2TiO_7$) | High | 265.5 | 83.8 | 88.2 | 79.0 | 1.55 |
| Example 1 | $Na_{3.9}Ti_{5.9}Nb_{0.1}O_{14}$ | Medium | 140.3 | 93.0 | 92.9 | 88.2 | 1.45 |
| Example 2a | $Na_3Ti_5NbO_{14}$ | Medium | 172.5 | 94.2 | 91.2 | 87.3 | 1.46 |
| Example 2b | $Li_{5.9}Na_3Ti_5NbO_{14}$ | Low | 171.3 | 99.1 | 90.8 | 86.9 | 1.46 |
| Example 3 | $Na_2Ti_4Nb_2O_{14}$ | Medium | 210.5 | 93.1 | 91.5 | 89.1 | 1.43 |
| Example 4 | $NaTi_3Nb_3O_{14}$ | Medium | 195.1 | 92.6 | 92.5 | 90.3 | 1.44 |
| Example 5 | $Na_{0.1}Ti_{2.1}Nb_{3.9}O_{14}$ | Medium | 245.5 | 92.6 | 91.1 | 89.2 | 1.50 |
| Example 6 | $Na_{2.75}Rb_{0.20}H_{0.05}Ti_5NbO_{14}$ | Medium | 191.3 | 90.5 | 92.6 | 87.1 | 1.45 |
| Example 7 | $Na_{2.75}Cs_{0.20}H_{0.05}Ti_5NbO_{14}$ | Medium | 190.9 | 90.8 | 92.9 | 87.0 | 1.45 |
| Example 7b | $Na_{2.95}H_{0.05}Ti_5NbO_{14}$ | Medium | 186.5 | 92.2 | 92.3 | 87.2 | 1.45 |
| Example 7c | $Na_3Ti_5NbO_{14}$ | Medium | 180.3 | 93.8 | 91.5 | 87.5 | 1.45 |
| Example 8a | $Na_{2.10}K_{0.85}H_{0.05}Ti_5NbO_{14}$ | Medium | 178.9 | 90.8 | 92.3 | 86.9 | 1.45 |
| Example 8b | $Na_{2.75}K_{0.20}H_{0.05}Ti_5NbO_{14}$ | Medium | 181.1 | 90.5 | 92.4 | 87.0 | 1.45 |
| Example 9 | $Na_2Ti_4Nb_{1.9}Ta_{0.1}O_{14}$ | Medium | 210.3 | 92.9 | 91.0 | 90.3 | 1.43 |
| Example 10 | $Na_2Ti_4Nb_{1.9}V_{0.1}O_{14}$ | Low | 216.5 | 91.1 | 92.1 | 91.2 | 1.43 |
| Example 11 | $Na_{1.9}Ti_4Nb_{1.9}Mo_{0.1}O_{14}$ | Medium | 213.3 | 92.0 | 91.7 | 89.9 | 1.43 |
| Example 12 | $Na_{1.9}Ti_4Nb_{1.9}W_{0.1}O_{14}$ | Low | 210.4 | 92.6 | 89.9 | 90.6 | 1.43 |
| Example 13 | $Na_2Ti_{3.9}Zr_{0.1}Nb_{2.0}O_{14}$ | Medium | 209.3 | 93.4 | 90.1 | 89.3 | 1.43 |
| Example 14 | $Na_2Ti_{3.9}Sn_{0.1}Nb_{2.0}O_{14}$ | Low | 215.2 | 92.7 | 91.5 | 89.0 | 1.43 |
| Example 15 | $Li_{0.1}Na_2Ti_{3.9}Fe_{0.1}Nb_{2.0}O_{14}$ | Low | 217.5 | 94.1 | 92.3 | 91.8 | 1.43 |
| Example 16 | $Li_{0.1}Na_2Ti_{3.9}Co_{0.1}Nb_{2.0}O_{14}$ | Low | 215.9 | 93.5 | 91.2 | 90.8 | 1.43 |
| Example 17 | $Li_{0.1}Na_2Ti_{3.9}Mn_{0.1}Nb_{2.0}O_{14}$ | Low | 213.3 | 93.0 | 91.9 | 90.1 | 1.43 |
| Example 18 | $Li_{0.1}Na_2Ti_{3.9}Al_{0.1}Nb_{2.0}O_{14}$ | Medium | 207.5 | 94.3 | 89.6 | 90.5 | 1.43 |

As is evident from the results shown in Table 7, electrode capacities of Examples 1 to 18 were higher than those of Comparative Examples 1 and 2. Thus, it is clear that the products in Examples 1 to 18 can provide batteries capable of exhibiting higher electrode capacities than that of the batteries provided by using the products in Comparative Examples 1 and 2.

On the other hand, as is evident from Table 7, electrode potentials with respect to metal Li at SOC 50% (state in which half of the charge capacity is charged) in Examples 1 to 18 were within the range of 1.50 to 1.43 V. This range was lower than that of Comparative Example 3. By using products capable of exhibiting a lower negative electrode potential, a higher battery voltage can be achieved. Thus, the products in Examples 1 to 18 can provide batteries capable of exhibiting higher battery voltages than that of the batteries provided by using the product in Comparative Example 3.

Thus, it is clear that the electrode capacity and the electrode potential can be well balanced by the products of Examples 1 to 18. As a result, the products of Examples 1 to 18 can provide a battery exhibiting a high energy density, and eventually, a battery pack exhibiting high energy density.

Further, as is evident from Table 7, electrochemical measurement cells of Examples 1 to 18 can exhibit an excellent balance among the electrode capacity, rate performance, life characteristics, and electrode potential.

Particularly regarding the rate performance, the electrochemical measurement cell containing product of each of Examples 6, 7a, 7b, 8a, and 8b in which protons or crystal water was contained in the crystal structure exhibited rate performance superior to that in, for example, Example 7c. This can be considered to be an effect caused by lithium ions made more movable due to the extension of crystal lattice.

Also, the products in Examples 15 to 17 in which a transition metallic element such as Fe, Mn, and Co was contained in the crystal lattice exhibited low power resistance. It is considered that, in each of the products of Examples 15 to 17, an electronic conductivity in the lattice was improved due to this, and improved rate performance was exhibited.

Then, the products of Examples 10 and 11 in which a transition metallic element such as Mo and V was contained in the crystal structure are low-melting compounds. Therefore, it is considered that the products in Examples 10 and 11 had high crystallinity and as a result, the rate performance was improved.

Should be noted that, as described above, the symmetry of the crystal structure of products in Examples 6, 7a, 7b, 8a, and 8b obtained via proton exchange cannot be identified. However, as is evident from Table 7, these products having a monoclinic crystal structure can exhibit, as is the case with the products in other Examples, an excellent balance among the electrode capacity, rate performance, life characteristics, and electrode potential.

An active material for a battery according to at least one of the embodiments and Examples described above contains a composite oxide having a monoclinic crystal structure. The composite oxide is represented by the general formula of $Li_wNa_{4-x}M1_yTi_{6-z}M2_zO_{14+\delta}$. The composite oxide can achieve a high charge-and-discharge capacity. Also, the average operating potential of the composite oxide can be adjusted by changing the Na amount and can take values within the range of 1.2 V (vs. Li/Li) to 1.5 V (vs. Li/Li$^+$). Further, the composite oxide can have a crystal structure facilitating insertion/extraction of lithium ions into/from the crystal structure. As a result, the active material for a battery can provide a nonaqueous electrolyte battery capable of exhibiting a high charge-and-discharge capacity, a high battery voltage, and excellent life characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An active material comprising a composite oxide having a monoclinic crystal structure and represented by a general formula of $Li_wNa_{4-x}M1_yTi_{6-z}M2_zO_{14+\delta}$, wherein
   the M1 is at least one element selected from the group consisting of Rb, Cs, K and H,
   the M2 is Nb and/or Ta; or a combination of Nb and/or Ta and at least one metallic element selected from the group consisting of Zr, Sn, V, Mo, W, Fe, Co, Mn and Al, and
   w is within a range of $0 \leq w < 12$, x is within a range of $0 < x < 4$, y is within a range of $0 \leq y < 2$, z is within a range of $0 < z \leq 1$, and $\delta$ is within a range of $-0.3 \leq \delta \leq 0.3$.

2. The active material according to claim 1, wherein the M2 is pentavalent Nb and/or pentavalent Ta, or a combination of pentavalent Nb and/or pentavalent Ta and at least one element selected from a group consisting of trivalent Fe, Co, Mn and Al, tetravalent Zr and Sn, pentavalent V, and hexavalent Mo and W.

3. The active material according to claim 1, wherein the crystal structure of the composite oxide has symmetry belonging to any one of space groups C2/m, C2, and Cm.

4. The active material according to claim 1, wherein a value of x is larger than a value of y.

5. The active material according to claim 1, wherein the M2 is Nb.

6. The active material according to claim 1, wherein the composite oxide comprises a crystal water in an amount of 0.1 mol to 2 mol per 1 mol of the composite oxide.

7. The active material according to claim 1 which is used for a battery.

8. A nonaqueous electrolyte battery comprising:
   a negative electrode comprising the active material according to claim 1;
   a positive electrode; and
   a nonaqueous electrolyte.

9. A battery pack comprising the nonaqueous electrolyte battery according to claim 8.

10. The battery pack according to claim 9, further comprising:
    an energizing external terminal; and
    a protective circuit.

11. A battery pack comprising nonaqueous electrolyte batteries, each of the nonaqueous electrolyte batteries comprising:
    a negative electrode comprising the active material according to claim 1;
    a positive electrode; and
    a nonaqueous electrolyte;
    wherein the nonaqueous electrolyte batteries are connected in series, in parallel or with a combination of series connection and parallel connection.

12. A vehicle comprising the battery pack according to claim 9.

13. The vehicle according to claim 12, wherein the battery pack is configured to recover a regenerative energy caused by a power of the vehicle.

* * * * *